United States Patent [19]

Usagawa et al.

[11] Patent Number: 5,455,451

[45] Date of Patent: Oct. 3, 1995

[54] SUPERCONDUCTIZED SEMICONDUCTOR DEVICE USING PENETRATING COOPER PAIRS

[75] Inventors: Toshiyuki Usagawa, Yono, Japan; Masashi Kawasaki, Montrose, N.Y.; Kensuke Ogawa, Hachioji; Toshiyuki Aida, Chofu, both of Japan

[73] Assignee: Hitachi, Ltd., Tokyo, Japan

[21] Appl. No.: 50,711

[22] Filed: Apr. 22, 1993

Related U.S. Application Data

[63] Continuation of Ser. No. 567,312, Aug. 14, 1990, abandoned.

[30] Foreign Application Priority Data

Aug. 18, 1989 [JP] Japan ................................ 1-211310
Sep. 25, 1989 [JP] Japan ................................ 1-246281

[51] Int. Cl.$^6$ .................... H01L 29/161; H01L 23/48; H01B 12/00
[52] U.S. Cl. ................ 257/661; 257/14; 257/30; 257/187; 257/663; 427/62; 427/63; 505/220; 505/235
[58] Field of Search ................ 357/5, 16, 17; 505/1, 701, 703, 813, 191–193, 220, 235, 238, 856; 257/187, 197, 663, 30, 37, 38, 14, 15, 30, 607, 661

[56] References Cited

U.S. PATENT DOCUMENTS

| | | | |
|---|---|---|---|
| 4,837,609 | 6/1989 | Gurvitch et al. | 357/5 |
| 4,843,446 | 6/1989 | Nishino et al. | 357/5 |
| 4,881,238 | 11/1989 | Chinone et al. | 357/17 |
| 5,023,687 | 6/1991 | Tanoue et al. | 257/197 |
| 5,063,426 | 11/1991 | Chandrasekhar et al. | 257/197 |
| 5,150,185 | 9/1992 | Yamada | 257/197 |
| 5,212,150 | 5/1993 | Yamazaki | 257/663 |

FOREIGN PATENT DOCUMENTS

| | | |
|---|---|---|
| 0250886 | 7/1988 | European Pat. Off. |
| 0357321 | 7/1990 | European Pat. Off. |
| 57-176780 | 10/1982 | Japan ............ H01L 39/22 |
| 61-218192 | 9/1986 | Japan ............ H01S 3/18 |
| 63-302581 | 9/1988 | Japan ............ H01L 33/00 |
| 63-262882 | 10/1988 | Japan ............ H01S 3/16 |
| 63-263783 | 10/1988 | Japan ............ H01L 39/22 |
| 63-316493 | 12/1988 | Japan ............ H01L 39/22 |

OTHER PUBLICATIONS

"Influence of Short Coherence Length on the Superconducting Proximity Effect of Silicon–Coupled Junctions", Hatano et al Appl. Phys. Lett., vol. 53, #5, Aug. 1988, pp. 409–411.

"S–N–S Josephson Junction Consisting of Y–Ba–Cu–O/Au/Nb Thin Films", Akoh et al, Jap. J. Appl. Phys., vol. 27, #4, Apr. 1988, pp. L519–L521.

"Y–Ba–Cu–O/Nb Tunnel Type Josephson Junctions", Atsuki et al, Jap. J. Appl. Phys., vol. 29, #9, Sep. 1987, pp. L1443–L1444.

"Carrier–Concentration Dependence of Critical Superconducting Current Induced by the Proximity Effect in Silicon", Nishino et al, Physical Rev. B, Feb. 1986, pp. 2042–2045 vol. 33, #3.

Ohnaka et al, "A Low Dark Current InGa As/InP P–I–N Photodiode with Covered Mesa Structure," IEEE Transactions on Electron Devices, vol. ED–34, No. 2, Feb. 1987, pp. 199–204.

(List continued on next page.)

Primary Examiner—Mahshid D. Saadat
Attorney, Agent, or Firm—Kenyon & Kenyon

[57] ABSTRACT

Superconductized electronic devices, such as a Josephson junction device, or superconductized optical devices represented by a light emitting and receiving devices of semiconductor laser are available using semiconductor materials which normally have no superconducting characteristics. The devices can operate by controlling the behavior of a Cooper pair in an active region which is formed in the semiconductor in advance using the penetrating phenomenon of the Cooper pair caused in the semiconductor proximate to the superconductor.

37 Claims, 27 Drawing Sheets

OTHER PUBLICATIONS

"Superconducting Proximity Effect in the Native Inversion Layer on InAs", Takayanagi et al, Phys. Rev. Lett., vol. 54, #22, Jun. 1985, pp. 2449–2452.

"Physics of Semiconductor Devices", Sze, 2nd Edition, Wiley–Interscience Publication, 1981 Sec. 12.5 Laser Operating Characteristics, pp. 724–730.

"Feasibility of hybrid Josephson field effect transistors", J. Appln. Phys., vol. 51(5), May 1980, pp. 2736–2743, T. D. Clark.

"Observation of semiconductor–semimetal transition in INAS–GaSb superlattices", Appl. Phys. Lett. 35(12), 15 Dec. 1979, pp. 939–942, L. L. Chang.

Applied Physics Letters, vol. 49, No. 25, Dec. 22, 1986, pp. 1741–1743, A. W. Kleinsasser et al., "n–InAs/GaAs heterostructure superconducting weak links with Nb electrodes".

IEEE Transactions on Electron Devices, vol. 36, No. 11, Nov. 1989; p. 2628, Proceedings of the 47th Annual Device Research Conference, 19th–21st Jun. 1989, A. W. Kleinsasser et al., "InGaAs superconducting JFET's with NK electrodes".

Extended Abstracts, Electrochemical Society, No. 87–2, 1987, p. 1087, H. Hayakawa, "Josephson junction materials and technology".

B. D. Josephson in Physics Letter, vol. 1, p. 251, 1962.

"Ultra High Josephson Devices", edited by Y. Hayakawa, Baifukan, 1986.

T. D. Clark et al., "Feasibility of Hybrid Josephson Field Transistor", Journal of Applied Physics, vol. 51, No. 5, pp. 2736–2743, May 1980.

Physical Review, vol. B33, p. 2042, 1986.

T. Usagawa et al., IEDM 87 Technical Digest, pp. 78–81.

ONE SEMICONDUCTOR CHIP

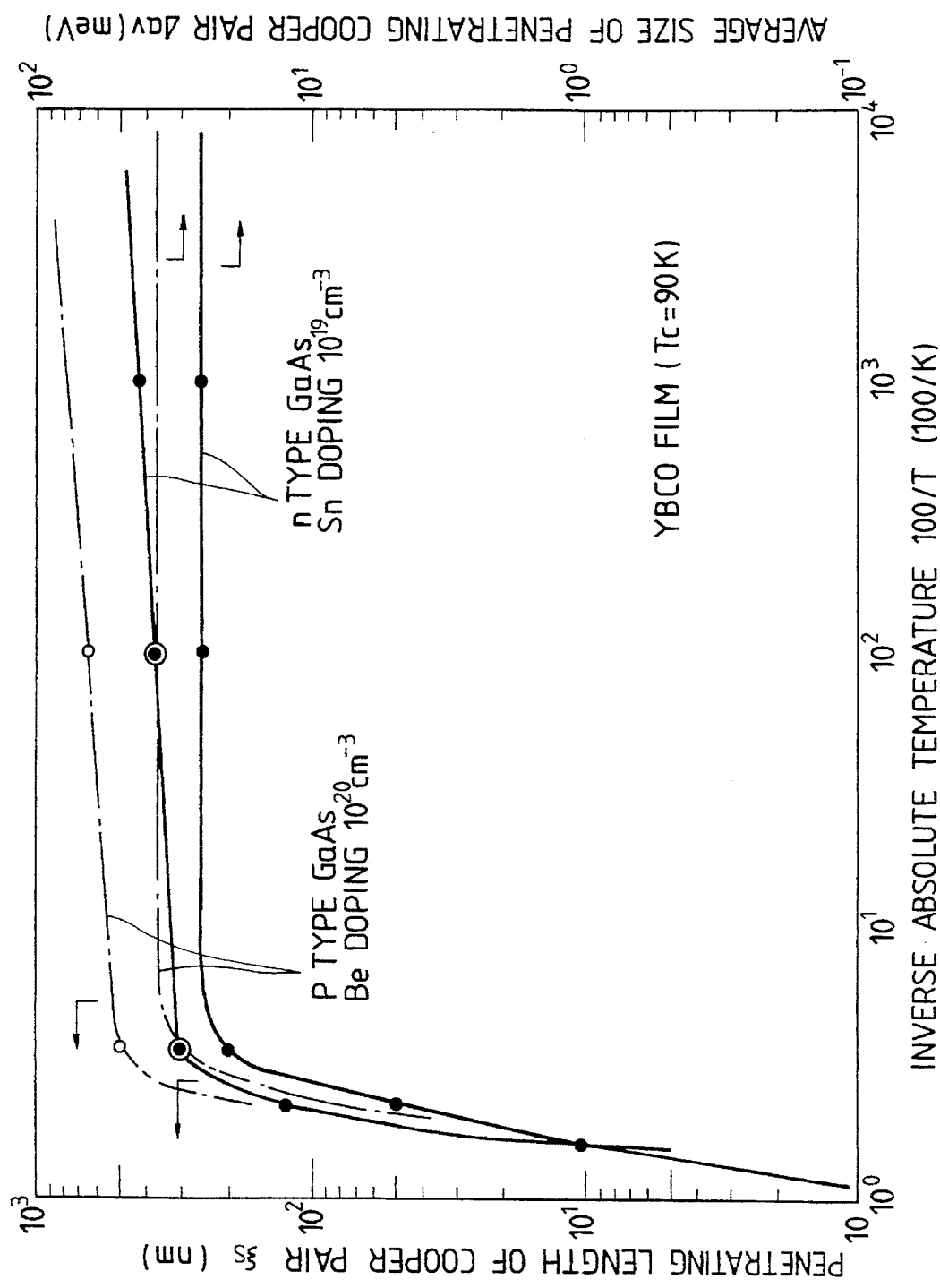

SUPERCONDUCTIZED SEMICONDUCTOR DEVICE USING PENETRATING COOPER PAIRS

This application is a continuation of application Ser. No. 07/567,312, filed on Aug. 14, 1990, now abandoned.

BACKGROUND OF THE INVENTION

The present invention relates to a superconductized semiconductor device with use of proximity effect superconductivity, and more particularly concerns a superconductized semiconductor device preferable for use as a Josephson junction device in a semiconductor memory circuit or a logic circuit which operates at an ultra high speed with small power consumption in an electronic computer, for use as a light emitting device which is represented by a high speed modulation semiconductor laser device used in an optical fiber communication system, an optical information processing system, or the like, or for use as a light emitting device such as a photodiode having a high speed response characteristic.

First, the following describes electronic devices. Since a Josephson effect was predicted by B. D. Josephson in Physics Letters, Vol. 1, 1962, page 251, the Josephson junction device has been developed as a memory IC or logic IC of ultra high speed and ultra low power consumption. For details, as an example, see "Ultra High Josephson Devices", edited by Yoshio Hayakawa, Baifukan, 1986. The existing Josephson junction ICs face the following problems.

1. It is very difficult to make a film thickness of an ultra thin insulating layer of 1 to 3 nm with high quality and uniformity in the superconductor-insulator-superconductor (S-I-S) structure. In fact, in the Josephson junction, the tunnel Josephson current, Io, is widely dispersed as reflected by dispersion of the film thickness. It is also difficult to form LSIs of high yield as short circuits happen between the superconductors. This is due to pin holes appearing in the insulation layer and the like.

2. It is essentially difficult to make the tunnel Josephson current, Io, higher as the potential wall of the real insulation layer is as high as several eV. The result is that it is impossible to have a large current density with fine Josephson junction. The operation speed is made to slow down in a highly integrated LSI. The advantage of the high integration cannot be utilized.

However, although a Josephson junction IC has such problems, it provides a great merit which is not in the semiconductor device. It is very advantageous in that it can be made compact with very high integration. This is due to ultra low power consumption. This advantage leads to a possibility that the system such as an ultra super high speed super computer can be built in a compact structure.

An attempt was made to overcome above described problem 1 of the Josephson junction device, for example, in the Japanese Patent Laid-Open 57-176780. In this disclosure, the Josephson junction device is formed using a pn junction of degenerate semiconductors, for example, SnTe, GeTe, PbTe, and $SrTiO_2$, of which materials show superconductivity.

However, those superconducting degenerate semiconductors are defective in that they are limited in use of materials. The superconducting critical temperature is as low as 100 m°K. and the p type and n type carrier concentrations cannot be well controlled even for the superconducting degenerate semiconductors (the known ones of which are 1 limited in SnTe, GeTe, PbTe, $SrTiO_2$, and the like). As a result, the pn junction depletion layer thickness as the insulation layer is dispersed. This results in that the superconducting current is dispersed. Particularly, the usual silicon and GaAs degenerate semiconductors now used as electronic device LSIs, as is generally known, cannot be made to become either of the n type or p type superconducting state even if they are cooled to 10 μK which is the lowest temperature we can reach.

Also, a field effect transistor with use of superconduction and semiconduction proximity effect was proposed by T. D. Clark et al., "Feasibility of Hybrid Josephson Field Transistor", Journal of Applied Physics, Vol. 51, No. 5, pp2736–2743, May 1980. After that, the idea of T. D. Clark et al. was affirmatively verified in the experiment with use of Si by Nishino et al., Physical Review, Vol. B33, page 2042, 1986. The MOS-JOFET of T. D. Clark was an epoch making proposal in the sense that the semiconductor device was combined with the superconducting device.

However, there are two essential problems in applying the combined device to LSI. One is that the flowing superconducting current is too small to drive the wire capacitance and transistor capacitance when it is used in a practical circuit. In other words, its operation speed is slow, or it has no realistic merit. The other is that the superconducting current can be observed only in very minute gate length of around 0.1 μm. This means that a realistic circuit cannot be fabricated unless an ultra microprocessing technique can be fully used. This is not preferable for the silicon LSI which is to be increased in the integration in generation by generation. The problem that the sufficient superconducting current cannot be obtained is an essential defect based on the operational principle of the device.

Further, it was proposed in one disclosure that the existing S-I-S Josephson device was formed on silicon substrate to combine with the usual silicon device (for example, see the Japanese Patent Laid-Open 64-86576).

However, that disclosure does not resolve the above-described problems as the Josephson junction device itself is left in the existing structure. It is a feature that demand for reliability of an individual device, as seen in Si and GaAs, is strict, particularly in LSI. It is the most important for LSI to fully utilize its performance rather than the characteristics of the individual device.

On the other hand, as is well known, the silicon LSIs (large scale integrated circuits) include CMOS (complimentary metal oxide semiconductor) of large scale and low power consumption, bipolar ECL (emitter coupled logic) LSI of high speed and high power consumption, and Bi-CMOS LSI which is intermediate between the both LSIs.

However, the silicon LSIs have not achieved ultra high speed, large scale, and low power consumption.

Furthermore, attention is recently attracted to LSIs of FETs using compound semiconductor such as GaAs, including the so-called HEMT (high electron mobility transistor) LSI, and an HBT (heterojunction bipolar transistor). The FET is defective in that a little load driving capacity prevents actual high integration. The HBT also is defective in that high heat generation prevents actual high integration. It is not possible, that is, to achieve an LSI of ultra high speed, large scale, and low power consumption with the compound semiconductor FET or bipolar by itself.

Relationship between the power consumption and speed of the electronic devices used up to date is shown in FIG. 9, which is taken from Physical Society of Japan, "Supercomputers", p228, Baifukan, 1985.

In turn, this and the following paragraphs describe optical devices. Usual light emitting diodes can operate in the way such that a forward current is made to flow in the pn junction of the semiconductor, holes are injected into the valence band of the semiconductor, electrons are injected in the conduction band, and they are recombined directly or through the center of light emission to emit the light. The energy of the light emitted from the semiconductor light emitting diode is equal to or lower than the energy corresponding to the band gap, Eg, of the semiconductor material in the active layer region.

The situation is same as in the semiconductor laser. In the semiconductor laser, forward current is made to flow in the pn junction of a direct transition type semiconductor, holes are injected into the valence band of the semiconductor, electrons are injected into the conduction band, a population inversion is formed, the holes and electrons are recombined to emit light, and the recombined emission light is amplified as stimulated emission in a resonant cavity to oscillate laser light. The energy of the light emitted from the semiconductor laser, therefore, is limited to around the band gap, Eg, of the semiconductor material in the active layer region.

In the laser using the usual III–V semiconductor material, wavelengths can be selected to some degree by selecting semiconductor materials and by controlling the band gap with crystal mixturization of them. The energy of the light emitted, however, was around 0.3 eV to 2.5 eV.

The following lists some problems of the existing light emitting and receiving devices. The first problem is associated with the laser light of high energy. To achieve higher energy of laser light, the following two attempts have been made.

One is use of semiconductor materials having greater band gaps. The materials available include II–VI semiconductors, such as CdTe, ZnSe, ZnS, and IV semiconductors, such as SiC and diamond. Parts of these materials cannot be practically employed as they need a high voltage power supply for generation of electron ray and a vacuum atmosphere, although laser oscillation was confirmed in the electron beam enhancement. We have not developed yet a process for obtaining a quality crystal which can be available for use as semiconductor light emitting diode or semiconductor laser. We also have not established yet a method of doping. Though there are examples of the light emitting diode with use of the materials mentioned above, they have a problem that their light emission efficiencies are too low. (For details, for example, see Shigeo Fujita, Oyobutsuri, Vol. 54, pp40–47, 1985.)

In other attempts a method provides that a light of semiconductor laser is irradiated onto a nonlinear optical crystal to emit higher harmonics by way of the nonlinear optical effect. This method also is defective in that the apparatus cannot be made smaller as a multiple of components of the semiconductor laser and nonlinear optical crystal are used. It further is defective in that it cannot obtain a high output power as the emission efficiency of the higher harmonics is too low. (For details, see Takatomo Sasaki, Oyobutsuri, Vol. 58, pp895–903, 1989.)

The second problem in the usual light emitting and receiving devices is that a threshold current of the laser oscillation is to be decreased. In order to efficiently start the laser oscillation at a low threshold current, in general, it is necessary to make larger the shape of the carrier energy distribution in the vicinity of the band gap. In the existing semiconductor laser, for example, the active layer makes use of a quantum well structure in place of the semiconductor bulk crystal to achieve lower threshold current and more narrow spectra. First, the following describes principles of the operation. Let us consider the distribution states of electrons and holes with the same amount of electrons enhanced in the two cases: the bulk semiconductor crystal and quantum well structure semiconductor. FIGS. 2A and 2B show dependency of the density of states (axis of abscissas) on the energy (axis of ordinates)of the bulk semiconductor and quantum well structure semiconductor respectively. The curve 201 indicates a density of states of the conduction band, 202 is a density of states of the valence band, 203 is an energy distribution of the electrons, and 204 is an energy distribution of the holes. Owing to change of the bulk to quantum well structure, the energy distributions of electrons and holes are changed. The quantum well structure has larger energy distribution around the band gap than the bulk. This can explain that the oscillation threshold value of the semiconductor laser using the quantum well structure is lower. (For details and examples, see Okamoto et al., Oyobutsuri, Vol. 52, pp843–851, 1983.)

Another known method for changing the dependency of the density of states on the energy is to use of quantization of cyclotron movement of carriers in a strong magnetic field. (For details, see the Japanese Patent Laid-Open 64-68994 and Okamoto et al., Oyobutsuri, Vol. 52, pp-843–851, 1983.) The density of states of the bulk semiconductor shown in FIG. 2A is split into Landau levels as shown in FIG. 2C. In this case, also, the density of states rises up sharply at the band edges. It is clear that the effect obtained is similar to that of the quantum well structure. However, it is not realistic in view of prevention from small size and adverse effect of magnetic field to other units in that it has to coexist with a magnetic field generator, including a superconducting magnet.

In the above examples where the density of states is changed by the quantum well structure or magnetic field, the dependency of the density of states on the energy can be made sharp at the band edge. It however cannot make sharp the carrier density distribution on the high energy side that is determined by the injected carrier concentration.

As an example which is fundamentally different in nature from the ones mentioned above, a laser using light emission from a Bose condensation system of exiton was proposed. (See the Japanese Patent Laid-Open 61-218192.) The following describes a principle of the proposed laser briefly. Electrons and holes are two-dimensionally accumulated on both sides of a tunnel wall layer formed in a heterojunction semiconductor, respectively. FIG. 2D shows a band diagram and carrier distribution state in that condition. The electron 216 and hole 217 separated by a tunnel barrier wall 215 in a semiconductor 213 and 214 of narrower band gap enclosed by a semiconductor 211 and 212 of wider band gap form an exiton by an Coulomb interaction. The electron and hole can be made to recombine to emit light as tunneling the barrier wall when the film thickness of the tunnel barrier layer 215 is optimized. The emitted light is induction amplified by a resonant cavity to make the laser oscillate.

If the exiton system is Bose condensed at a low temperature, a superradiance laser can be accomplished. The superradiance laser provides 1/10 of light spectrum width and 1/10000 of laser oscillation threshold current as compared with the usual semiconductor laser. In the superradiance laser, however, the electron and hole to be recombined are separated spatially, and the recombination probability is dominated by overlap of wave functions in the tunnel barrier layer. Its light intensity, therefore, cannot be theoretically made high. As it also is essentially difficult to make the concentration of the exiton system high, the Bose condensation cannot be made at a practical temperature, which is higher than 10° K. or so.

Similarly, a laser using a superconductor is known as a Bose condensed electron system. There are two operational principles in the type of laser. One is that an electron quasi-particle and hole quasi-particle are injected into the superconductor having a gap $\Delta$, and when they are recombined a light of $2\Delta$ is radiated and laser oscillated. (For details, for example, see the Japanese Patent Laid-Open 63-302581 and the Japanese Patent Laid-Open 63-263783.) This concept is based on an idea that in the superconductor, the quasi-particle having an energy of $2\Delta$ higher than the ground state is population inverted, the energy being caused by decay of the Cooper pair.

However, it is theoretically difficult that the ground state and quasi-particle state are population inverted by injecting the electron and hole with the superconducting state kept. Even if it can made laser oscillation, the light radiated from the laser is limited in microwave to infrared ray as the existing known superconductor has a gap energy of several meV to 50 meV at most.

In the other operational principle of a laser, a superconductor and a transparent insulating film are laminated to form a Josephson junction. A potential $\delta V$ is applied across the superconductor partitioned by the insulating film to radiate a photon having an energy of $2q\delta V$, where q is a unit charge. (For details, for example, see the Japanese Patent Laid-Open 63-316493 and the Japanese Patent Laid-Open 63-262882.)

However, in the S-I-S structure, the wave functions of the Cooper pair cannot be overlapped in the same position of the insulator. In fact, it can obtain little light emission. It also is very difficult to make the insulating layer to have a high quality and uniformity with ultra thin single crystal film of 1 to 3 nm. It is dominated by a non-radiative transition through a trap in the insulating layer. The laser therefore has not be realized yet as light emitting device.

A third problem of the existing light emitting and receiving devices is that the relaxation frequency, fr, is too low. In the ultra high speed optical communication, a high relaxation frequency is indispensable. Even in the existing modulation doping-multiple quantum well laser which can operate at the highest speed, it is 40 GHz at most. (For details, for example, see Kazuhisa Uomi, Oyobutsuri, Vol. 57, pp708–713, 1988.) In the usual laser, it is around 10 GHz.

There is no example that light emission and reception processes from a coherent electronic system have been experimentally proved. There are many points to be elucidated as to the the basic process of light emission and reception.

SUMMARY OF THE INVENTION

There are no bounds to our demand for ultra higher speed, larger scale, lower power consumption of memory and logic LSIs in the field of ultra high speed supercomputers and high capacity image processing systems.

In view of the foregoing, it is a general object of the present invention to provide a device of which the speed and power consumption are as ultra high and low as the Josephson device shown in FIG. 9 with use of superconductor and/or semiconductor in a semiconductor, such as GaAs or Si, which has no superconductivity itself. An aim of the semiconductor device according to the present invention is marked with • in FIG. 9.

Recent study of the proximity effect of superconductor and semiconductor have progressed so that the proximity mechanism into the semiconductor of a Cooper pair has been gradually made clear. (For example, see Tanaka and Tsukada, "Superconduction Proximity Effect", Kotai Butsuri (in Japanese), Vol. 23, No. 3, pp153–162, Agne Technical Center, 1988, and reference materials.) The study, however, relates to the proximity effect of metal superconductor/semiconductor. It does not deal with the proximity effect of a high Tc superconductor/semiconductor junction at tens of °K. of transition point.

The inventors measured the penetrating length $\xi s$ of the Cooper pair into the semiconductor in the junction of high Tc superconductors including an oxide high Tc superconductor $YBa_2Cu_3O_7$ (hereinafter referred to as YBCO)/Au of 50 nm thick/Mo of 10 nm thick/W of 40 nm thick/n type semiconductor GaAs or p type semiconductor GaAs, at a transition point Tc of 90° K. They also measured a superconducting gap $\Delta_1$ in the semiconductor. The results of the measurements are given in Table 1.

TABLE 1

|  | Measuring temperature is 4.2° K. | |
| --- | --- | --- |
|  | n type GaAs Sn dope $1 \times 10^{19}$ cm$^{-3}$ | p type GaAs Be dope $1 \times 10^{20}$ cm$^{-3}$ |
| Penetrating length of Cooper pair $\xi s$ | 300 nm | 500 nm |
| Average size of penetrating Cooper pair $\Delta_1$ | 20 meV | 30 meV |

The results of the measurements can be summarized as follows.

1. The penetrating length $\xi s$ is 300 nm to 500 nm.
2. The average size $\Delta av$ of the superconducting gap $\Delta_1$ of the proximity Cooper pair is 20 meV to 30 meV.

The reason that buffer metals Au/Mo/W are inserted between the superconductor and GaAs in the structure used here is as follows. If the oxide superconductor is fit to GaAs in the atmosphere of oxygen, GaAs is oxidized, resulting in insertion of the insulating layer, dropping of As, or no superconduction of the oxide superconductor. The oxide superconductor, therefore, is formed on Au which is not to be oxidized. The gold Au, however, cannot be stably deposited on GaAs directly. Since it also can start acting with GaAs at 470° C., it diffuses into GaAs. As the substrate temperature is set at 400° to 550° C. in the process of doping YBCO, further, a high heat resisting metal, W, which is not to act with Au was used as buffer metal in order to prevent GaAs from acting with the buffer metal and to prevent Au from diffusing in GaAs. Molybdenum, Mo, furthermore, was inserted to make better adhesion of Au on W.

The reason for insertion of the buffer metal is to obtain high ohmic contact of the high Tc superconductor to the GaAs semiconductor. It is a matter of course that such a buffer metal is not necessary for the metal superconductors Nb, Pb, and the like.

The inventors further proceeded with the experiment mentioned above in systematic+measurement the penetrating length $\xi s$ of the Cooper pair into the semiconductor in the junction of the high Tc superconductors/buffer metal/semiconductor. They also measured the superconducting gap $\Delta_1$ in the semiconductor. FIG. 10A shows the results of experiment at doping levels of the n type GaAs and p type GaAs. It should be noted that the specific contact resistance, ρc, represents the specific contact resistance between the buffer metal and semiconductor with the semiconductor layer of 30 nm thick inserted, its concentration being changed. In the figure, $N_D$ and $N_A$ are the concentrations of the donor and acceptor of the penetrating semiconductor layer, respectively. FIG. 10B shows the penetrating length ξs for the Sn and Be doped GaAs in $N_D=10^{19}/cm^3$ and $N_A=10^{20}/cm^3$. The figure also shows a temperature change of the superconducting gap $\Delta_1$ in the semiconductor. The solid lines in FIGS. 10A and 10B indicate for the n type GaAs, and the broken lines are for the p type GaAs. The general conclusions obtained from the measurement results are as follows.

1. The penetrating length ξs can be controlled from 0 nm to 700 nm at maximum.
2. The penetrating length ξs depends on the doping level in an extremely high sensitivity.
3. The penetrating length ξs does not largely depend on the specific contact resistance ρc of the face of the buffer metal and semiconductor.
4. The average size Δav of the superconducting gap $\Delta_1$ of the penetrating Cooper pair largely depends on the specific contact resistance ρc and doping level. Particularly, the specific contact resistance ρc representing the degree of the ohmic characteristic has a large limit given.
5. The penetrating length ξs and the average Δav of the superconducting gap $\Delta_1$ of the Cooper pair do not largely change at a temperature lower than half of Tc (90° K. in the case).
6. The penetrating length ξs becomes 2 nm or lower when the semiconductor is not degenerated.

The following describes a physical concept of the proximity system. FIG. 1F shows a conceptual illustration of the distribution of the size |Δ| of the Copper pair potential on the surface in the direction perpendicular to the surface. In the figure, the size of the Cooper pair potential of the bulk in the superconductor is indicated by $|\Delta_0|$. Penetrating size of the Cooper pair into the semiconductor through the buffer metal and depletion layer is indicated by $|\Delta_1(x)|$. Then the penetrating length of the Cooper pair into the semiconductor is ξs, and the size of the average Cooper pair is Δav. In view of the concept, thus, there can be two divisions: the Cooper pair supply layer of the superconductor and the superconductized semiconductor layer rearranged by the proximity effect.

FIG. 1D shows a behavior of the density of states corresponding to the energy band diagram in the vicinity of the conduction band of the superconductized degenerate semiconductor of n type. There is a Fermi level, $E_F$, at a position qVc from the conduction band edge, $E_C$ to make the superconducting gap 2Δ open. The actual value of qVc depends on the value of the impurity concentration, as $qVc=E_F-E_C$. In the degenerate semiconductor, $qVc \geq 0$. The portion of slanting lines from the conduction band edge $E_C$ in the figure is the region of the condensed Cooper pair. In the conceptual diagram (right side of FIG. 1D) for the corresponding density of states energy E, there is no state in the superconducting gap 2Δ. The original state is distributed to upper and lower sides of the gap.

FIG. 1E shows a behavior of the state density corresponding to the energy band diagram in the vicinity of the valence band of the superconductized degenerate semiconductor of p type. There is a Fermi level, $E_F$, at a position qVc from the valence band edge, to make the superconducting gap 2Δ open. $qVv=E_V-E_F$. In the degenerate semiconductor, $qVv \geq 0$. The portion of slanting lines from the valence band edge $E_V$ in the figure is the region of the condensed Cooper pair. In the conceptual diagram (right side of FIG. 1E) for the corresponding density of state energy E, there is no state in the superconducting gap 2Δ. The original state is distributed to upper and lower sides of the gap.

It is intuitively difficult to understand penetrating of the Cooper pair into the p type semiconductor. It however can be conceived rather easily in the way that electrons are filled up to the Fermi level, and there are vacant positions for the electron from the valence band edge $E_V$ to the Fermi level. Such a physical sketch is the same as in the proximity effect in the junction of the metal superconductor, such as Nb or Pb, and the degenerate semiconductor GaAs or Si of n (p) type except that the value of the superconducting gap is different.

From the experimental facts, the inventors considered that in the junction of superconductor and semiconductor, the semiconductor itself can change to superconductor of superconducting gap Δ around the penetrating length ξs of the Cooper pair into the semiconductor so that the superconductor can be regarded as the Cooper pair supply layer into the semiconductor.

In view of application of the phenomenon mentioned above to electronic devices, the semiconductor itself can be regarded as superconductor in the penetrating length ξs, opening the way to achieve a variety of superconducting devices, such as superconductized semiconductor Josephson junction device, using the semiconductor. Particularly, the penetrating length ξs can be controlled in a range of 1 nm to 500 nm by appropriately selecting the carrier concentration of the semiconductor. The superconductized semiconductor devices, which are impossible in the conventional techniques, can be accomplished in the new principle in the way that desired crystal structures can be designed in the penetrating distance ξs of the Cooper pair into the semiconductor.

The devices of the present invention described below are superconductized semiconductor devices which can behave as if the semiconductor can be a superconductor by using the proximity effect of superconductor in a semiconductor that has no superconduction characteristic originally. The present invention is essentially different from the Japanese Patent Laid-Open 57-176780 mentioned previously in that parts of the semiconductor having no superconduction characteristic originally at any temperature are converted to superconductor for use as electronic device by using the proximity effect. (The invention in the Japanese Patent Laid-Open 57-176780 is a Josephson junction device with use of the pn junction of a p type superconductor and a n type superconductor, or with use of the pn junction of degenerate semiconductor which shows superconductivity at a lowered temperature.)

Particularly, GaAs and silicon provide marked characteristics in the crystal completeness, no defects, no intergranularity, and the like as compared with the other materials, such as superconducting degenerate semiconductors mentioned above and insulators used in the conventional Josephson junction devices. The semiconductor, also, can be converted to superconductor by intervention of quality buffer metals used in the Si LSI and GaAs LSI, such as Au/Mo/WSi, and similar materials having no superconduction characteristic normally or even having it at an ultra low temperature. Therefore, the present invention's superconductized semiconductor cannot be lowered in yield as in the usual Josephson junction devices due to intergrains or similar causes of superconducting metals. The device of the present invention, further, has a great advantage in the use of the usual process technique of Si LSI and GaAs LSI and the device technique which have been advanced up to date in fabricating the devices.

Furthermore, the device of the present invention has an advantage that it can be easily integrated or combined with the existing Si device or GaAs (hetero) device. A conceptual illustration is shown in FIG. 1G.

This and the following paragraphs describe the device of the present invention with reference to an energy band diagram in detail. The semiconductor used for explanation is GaAs as an example. It can be achieved by Si or other semiconductors which will be described in the embodiments. FIGS. 1A, 1B, and 1C are energy band diagrams of the present invention which is applied to a superconducting Esaki diode, heterojunction superconducting Josephson junction device, and resonant tunneling superconducting diode, respectively. As for a hot Cooper pair transistor, this will be described in the embodiments with reference to FIGS. 6A, 6B, 6C, 6D, 6E, 6F, and 6G.

Though the present invention will be described employing principally the p-type semiconductor in the following, the following can be true similarly also in the case of employing n-type semiconductor inversely to the p-type one and the energy band diagrams thereof are shown on FIGS. 4A, 4B and 4C.

First, the superconducting Esaki diode is described below with reference to FIG. 1A. The usual Esaki diode is featured in that it is a negative resistance diode as shown in FIG. 3D. In the diode are formed a superconductor 101 of superconducting gap $\Delta_0$, a buffer metal 102, a p type degenerate semiconductor 103, and a n type degenerate semiconductor 104. It should be noted that as the buffer metal 102 plays a role of protecting the superconductor and semiconductor when the junction of the superconductor/semiconductor is made, it is not needed from the device operation point of view. The film thicknesses and doping levels of the p type degenerate semiconductor 103 and n type degenerate semiconductor 104 are designed so that the Cooper pair can penetrate into the n type degenerate semiconductor 104. The film thickness of a depletion layer 121 of the pn junction of the semiconductors and the impurity concentration of the p and n type semiconductor layers are determined so that the negative resistance of the Esaki diode due to quasi-particles should appear. It also is preferable in designing to improve the ohmic contact between the buffer metal 102 and semiconductor 103 to maximize the Cooper pair penetrating length and to minimize the attenuation of the penetrating Cooper pair in the semiconductor. For this purpose, the Schottky barrier between the buffer metal 102 and semiconductor 103 has to be as small as possible and has to make high the concentration of the semiconductor right under the buffer metal 102 to make the specific contact resistance $\rho c$ lower than $5 \times 10^{-6}$ $\Omega cm^2$ or so. In this case, as the thickness of the depletion layer 120 between the buffer metal 102 and semiconductor 103 is very thin, the Cooper pair and quasi-particle can penetrate into the semiconductor through the tunneling effect and the like. The superconducting gaps in the semiconductors 103 and 104 are indicated by $\Delta_1$ and $\Delta_2$. In the figure, $E_F$ is a Fermi level.

If the n type degenerate semiconductor 104 also has the Cooper pair supply layer made by proximity effect, as also will be described in details in the embodiments, it is not always necessary to make the Cooper pair penetrate from the p type degenerate semiconductor 103 into the n type degenerate semiconductor 104.

By setting the film thicknesses and doping levels of the layers as described above, the diode can become a Josephson junction device having the depletion layer as insulating layer by the Cooper pairs existing in the p type degenerate semiconductor 103 and n type degenerate semiconductor 104. It can become a usual Esaki diode for the quasi-particles with the Cooper pairs excited. The current-voltage characteristic is shown in FIG. 3A. It should be noted that if a finite resistance is caused in the electrode connected to the n type degenerate semiconductor 104, the Josephson current Io is slanted to Io' due to the resistance component. This point will be discussed in detail in the embodiments. The Esaki diode by the quasi-particle has the maximum quasi-particle tunneling current Ip at the peak voltage Vp and the minimum current Iv at the valley voltage Vv. As the p type degenerate semiconductor 103 and n type degenerate semiconductor 104 are superconductized, the semiconductor of pn junction can behave as if it is a superconductor of superconducting gaps $\Delta_1$ and $\Delta_2$. The Josephson current Io therefore can flow as in the normal tunneling junction type Josephson junction device.

The diode is featured in that the Josephson current Io (superconducting current) and negative resistance can reflect the current-voltage characteristic as superimposed.

As the doping levels of the p type degenerate semiconductor 103 and n type degenerate semiconductor 104 is increased, the normal Esaki diode suffers a disappearance of the negative resistance, and has an ohmic characteristic. In that case, the superconductized semiconductor device according to the present invention has the normal Josephson junction current-voltage characteristic as in FIG. 3B. It should be noted that if a finite resistance is caused in the electrode connected to the n type degenerate semiconductor 104, also the Josephson current Io is slanted to Io' due to the resistance component. In this case, the current-voltage becomes like that of the Josephson junction device.

In turn, the following describes the heterojunction superconducting Josephson junction device with reference to FIG. 1B. In the diode are formed a superconductor 101 of superconducting gap $\Delta_0$, a buffer metal 102, a p type degenerate GaAs 105, an undoped $Al_xGa_{1-x}As$ 106, and a p type degenerate GaAs 107. It should be noted that as the buffer metal plays a role of protecting the superconductor and semiconductor when the junction of the superconductor/semiconductor is made, it is not needed in principal from the device operation point of view. The film thicknesses and doping levels of p type degenerate GaAs 105 and p type degenerate GaAs 107 and the Al composition x and film thickness L of the undoped $Al_xG_{a1-x}As$ 106, as in the superconducting Esaki diode, are designed so that the Cooper pair can penetrate into the p type degenerate GaAs 107. It also is similarly preferable in designing to make better the ohmic contact between the buffer metal 102 and p type degenerate semiconductor 105 to maximize the Cooper pair penetrating length and to minimize the attenuation of the penetrating Cooper pair in the semiconductor. In this case, the thickness of the depletion layer 122 between the buffer metal 102 and p type degenerate GaAs 105 is very thin, and the Cooper pair and quasi-particle can penetrate into the semiconductor through the tunneling effect and the like. Similarly, if the p type degenerate GaAs 107 also has the Cooper pair supply layer made by proximity effect, as also will be described in details in the embodiments, it is not always necessary to make the Cooper pair penetrate from the p type degenerate GaAs 105 into the p type degenerate GaAs 107.

By setting the film thicknesses and doping levels of the layers as described above, the diode can become a Josephson junction device having the undoped $Al_xGa_{1-x}As$ layer 106 as an insulating layer by the Cooper pairs existing in the p type degenerate GaAs 105 and p type degenerate GaAs 107. The current-voltage characteristic is shown in FIG. 3B. It should be noted that if a finite resistance is caused in the electrode connected to the p type degenerate GaAs 107, the Josephson current Io is slanted to Io' due to the resistance component. This point will be discussed in detail in the embodiments. As the p type degenerate GaAs 105 and p type degenerate GaAs 107 are superconductized, the semiconductor of p-i-p heterojunction can behave as if it is a superconductor of superconducting gaps $\Delta_1$ and $\Delta_2$. The Josephson current Io therefore can flow as in the normal tunneling junction type Josephson junction device.

In turn, the following describes features of the diode. In general, the Josephson current Io of Josephson junction S-I-S can be given as $$I_0 = \pi\Delta(T)/2qRn \cdot \tan h \{(T)/2kT\}$$

where $\Delta(T)$ is the size of the superconducting gaps of the both superconductors put between the insulating layer (for simplicity of explanation, the sizes of the two superconducting gaps are made equal here), $\pi$ is ratio of the circumference of a circle to its diameter, q is a unit charge, T is the absolute temperature, k is the Boltzmann constant, and Rn is the resistance of the junction. Rn can be given as $$Rn = ATnN_1N_2$$

where $N_1$ and $N_2$ are density of states of the both sides of the conductor put between the insulating layer, Tn is a tunneling probability that the carrier can transmit through the insulating layer, and A is a proportional coefficient which does not largely depend on material parameters.

In the S-I-S structure using the conventional insulator and metal superconductor, the transmission probability Tn of the tunneling barrier can be given as $$Tn = (1 + \{(\epsilon + U) \sin h (\kappa L)\}^2 / 4\epsilon U)^{-1}$$

where L is the film thickness of the insulating layer, U is the height of the potential barrier from the Fermi level, and $\epsilon$ is the kinetic energy at the Fermi level. In the equation, $\kappa = \{2m(U-\epsilon)\}^{1/2}/\hbar$, where $\hbar = h/2\pi$, and h is the Planck constant which is the imaginary wave number in the insulating layer.

The fact that is in common with the conventional insulating films such as $Al_2O_3$ is that with limitation of the filming technique, it is practically impossible to make the film thickness to less than 1.5 nm, but it is typically around 3 nm. As the property common to the insulating films, the potential barrier U cannot be designed as desired, usually being 3 eV to 5 eV. As can be seen from the equation of Tn, Tn depends on L and U to a great extent. For typical values in the conventional S-I-S structure, L=3 nm and $\epsilon = U = 3.2$ eV, $$Tn = .8 \times 10^{-6}.$$

In the heterojunction superconducting Josephson junction device (FIG. 1B), the potential barrier U can be formed using the heterobarrier. By changing the Al composition x in the hetero junction system of $GaAs/Al_xG_{1-x}As$, therefore, the potential barrier U can be designed in a range of 0 eV to 1 eV or so as desired. This means that Tn can be designed very high. The heterojunction system of $GaAs/Al_xG_{1-x}As$ can usually be composed of virtually complete single crystal using a crystal growing method, such as the molecular beam epitaxial (MBE) technique or the organic metal heat decomposition method (MOCVD). It is therefore possible to form the film thickness L and potential barrier U of the undoped $Al_xG_{1-x}As$ corresponding to the insulating layer controlled one atom layer by atom layer, with the insulating film of very high quality as compared with the conventional Josephson junction device. In fact, for typical values, L=3 nm and $\epsilon = U = 100$ meV, its barrier tunneling probability Tn is as high as five times of order of magnitude larger than in the conventional structure.

$$Tn = .28$$

The Josephson current Io also depends actually on the densities of states $N_1$ and $N_2$. If the usual metal, such as Nb, is used as Cooper pair supply layer, in which densities of states almost do not change, the reduction of the superconducting gap in the penetrating semiconductor plays a negative role to the Josephson current $I_0$. Even so, as the tunneling probability is overwhelmingly increased, the Josephson current Io can be increased around 100 to 1000 times compared with the usual one. If a high Tc superconductor is used as a Cooper pair supply layer, the densities of states can be reduced around one order of magnitude, and the superconducting gap is increased one order of magnitude. The Josephson current Io can be made further around 100 to 1000 times because of the overwhelming increase of the tunneling probability.

In the conventionally accomplished Josephson junction device, the typical junction capacitance $C_0$ is 5 $\mu F/cm^2$, and the typical Josephson current $I_0$ is $10^3$ A/cm$^2$. It is preferable for the figure of merit to make the junction capacitance $C_o$ as small as possible and to make the Josephson current $I_o$ as large as possible.

In the heterojunction superconducting Josephson junction device (FIG. 1B), the Cooper pair supply layer can be made of high Tc superconductor to obtain the Josephson current Io as high as 100 to 1000 times compared with the Cooper pair supply layer as of a usual metal superconductor such as Nb, Pb and the like, while its junction capacitance Co is 3 $\mu F/cm^2$ which is roughly equal to that of the conventional Josephson junction device if the Al composition x=0.45 and the film thickness L=3 nm.

The following describes the resonant tunneling superconducting diode (FIG. 1C). Unlike the heterojunction superconducting Josephson junction device (FIG. 1B), it uses a quantum well structure of heterojunction of undoped AlGaAs 111/undoped GaAs 110/undoped AlGaAs 109 in place of the undoped $Al_xGa_{1-x}As$ 106 of FIG. 1g. It is similar to the superconducting Esaki diode in that the film thickness LL of the three undoped layers, potential barrier height, film thicknesses of p type degenerate semiconductor 108 and p type degenerate semiconductor 112, doping level, and film thickness L of undoped GaAs 110 are designed so that the Cooper pair can penetrate into the p type degenerate semiconductor 112. It also is similar to that in designing to make better the ohmic contact between the buffer metal 102 and p type degenerate semiconductor 108 to maximize the Cooper pair penetrating length and to minimize the attenuation of the penetrating Cooper pair in the semiconductor. Usually, the depletion layer 123 between the buffer metal 102 and p type degenerate semiconductor 108 is very thin so that the Cooper pair and quasi-particles can penetrate into the semiconductor by the tunneling effect and the like. If the p type degenerate semiconductor 112 also has the Cooper pair supply layer made proximate thereto, as also will be described in details in the embodiments, it is not always necessary to make the Cooper pair penetrate from the p type degenerate semiconductor 108 into the degenerate semiconductor 102.

By setting the film thicknesses and doping levels of the layers as described above, the diode can become a resonant tunneling superconducting diode having typical current-voltage characteristics shown in FIGS. 3C and 3E. The operational characteristics of the diode will be discussed in detail in the embodiments.

In turn, the following describes semiconductor optical devices according to the present invention.

The present invention solves the technical problems involved in the usual semiconductor and superconductor optical light emitting and receiving devices mentioned previously and achieves the following objects.

1. Efficient emission and reception of lights having higher energy than the band gap.

2. Dependency of density of states on energy at a pseudo-Fermi level is made so sharp that it cannot be accomplished even by the quantum well structure. Laser oscillation, therefore, is made at a very low threshold.

3. The relaxation frequency fr is beyond around 100 GHz.

4. The light emitting and receiving process reflects a coherent factor $\phi$ of the coherent electronic system, which corresponds to the phase $\phi$ of superconductors.

5. Very narrow band. These features, as described below, can be achieved by the light emitting and receiving devices on the basis of new principles with use of the proximity effect of superconductor/semiconductor according to the present invention.

The inventors obtained the following knowledge as for injection of the Cooper pair. They formed a buffer metal layer 1102 and a superconductor layer 1101, like the ones mentioned previously, on epitaxial wafers of nip junction and pin junction of GaAs. They made an experiment that the Cooper pair penetrated into a n layer 1103 and a p layer 1105 is injected into an i layer 1104. In the following is described an example that the Cooper pair is injected from the n layer. FIG. 11A shows a band diagram in the thermal equilibrium condition of the structure. The length from the interface of the buffer metal layer 1102 and n layer 1103 to the depletion layer of the ni interface is sufficiently shorter than $\xi s$. In other words, superconductization is made in all parts of the n layer 1103 if bias is not applied thereto. The Cooper pair, that is, exists anywhere in the n layer 1103. FIG. 11B shows a band diagram when a forward bias voltage V is applied to the nip junction. It was found that the injection length $\xi_I$ into the i layer of the Cooper pair can be given as follows up to the forward bias voltage Va for flat band.

$$\xi_I = \xi_{IO} \exp\{q(V-Va)/kT\}$$

FIG. 11C shows the density of states and distribution state of the carrier in the region of the i layer 1104 into which the Cooper pair is penetrated. In the valence band is formed a hole pseudo-Fermi level $E_{Fh}$ determined in terms of the density of the holes injected from the p layer. In the conduction band is formed an electron pseudo-Fermi level $E_{Fe}$ determined in terms of the density of the electrons injected from the n layer. In the vicinity of the electron pseudo-Fermi level, however, penetrating of the Cooper pair makes the i layer semiconductor superconductized to make the gap $2\Delta_2$ open so that the level to exist in the gap originally can be distributed on the upper and lower sides of the gap. FIG. 13 shows results of the investigation of dependency of the injection length $\xi_{IO}$ into the i layer and the size $\Delta_2$av of the average gap on the specific contact resistance $\rho c$ and doping levels $N_D$ and $N_A$. The inventors obtained the following conclusions from the measurement results.

1. The injection length $\xi_{IO}$ can be controlled from 0 nm up to 100 nm.

2. The injection length $\xi_{IO}$ depends on the doping level to a great extent.

3. The injection length $\xi_{IO}$ does not largely depend on the specific contact resistance $\rho c$ on the interface of the buffer metal and semiconductor.

4. The average size $\Delta_2$av of the superconducting gap $\Delta_2$ of the injected Cooper pair largely depends on the specific contact resistance $\rho c$ and doping level. Particularly, the specific contact resistance $\rho c$ representing the degree of the ohmic characteristic has a large limit given.

5. The injection length $\xi_{IO}$ and the average size $\Delta_2$av of the superconducting gap $\Delta_2$ of the Cooper pair do not largely change at a temperature lower than half of Tc (90° K. in the case).

The superconducting gap $\Delta_0(T)$ becomes nearly equal to $\Delta_0(0)$ at $T \leq 0.8$ Tc. As $\Delta_0(0)$ is several times kTc, $2\Delta_1$ becomes nearly equal to kT at $T \leq 0.8$ Tc. In the density of states distribution, the statistic distribution of the quasi-particle electrons and quasi-particle holes obeys the usual Fermi-Dirac statistics. The dependency of the density of the electrons (including the Cooper pair) on the energy changes far sharply as compared with the case of no Cooper pair penetration. This can be contrasted to the fact that the density of states distribution is sharp at the semiconduction band edge in the method that the density of states is changed by way of introduction of quantum structure and strong magnetic field as in FIGS. 2B and 2D.

In turn, the following describes the relaxation process of the Cooper pair injected. If the Cooper pair which was stable in the n layer is injected into the conduction band of the i layer with the holes injected in the valence electron band of the i layer, then the electron and hole forming the Cooper pair recombine together to relax. There are three kinds of recombination process.

1. A recombination process of the Cooper pair with two holes injected into the valence electron band at a time.

2. A recombination process of one electron forming the Cooper pair with one hole injected into the valence electron band.

3. A recombination process of a thermally dissociated Cooper pair, or quasi-particle electron with a hole injected into the valence electron band.

There are two recombination processes: a radiation recombination and non-radiation recombination. The following discusses only the radiation recombination. The first transition process includes two cases that one photon is radiated and that two photons of the same energy are radiated. If the Cooper pair and two holes radiate one photon to recombine, the energy of the photon is around two times the band gap Eg. In the other case, the energy of the photon is around equal to Eg. The light radiated in the process 2, however, is $2\Delta_2$ lower than the light radiated in the process 3 as it reflects the bound state of the Cooper pair.

In the example described above, there is the Cooper pair supply layer only on the single side of the nip junction of the semiconductor. In the example described below, the Cooper pair supply layer is provided on both sides of the nip junction. FIG. 11D shows the band diagram of the structure of a superconductor layer 1101/n-GaAs 1103/i-GaAs 1104/p-GaAs layer 1105/superconductor layer 1101' with a forward bias applied thereto when the lengths from the semiconductors to the i layer are shorter than $\xi s$ as was described previously. In the figure are shown a buffer metal layer 1102 and buffer metal layer 1102'. Electrons are injected from the n layer into the conduction band of the i layer. Following this, the Cooper pair also is injected therein. Similarly, holes are injected from the p layer into the valence band of the i layer. Following this, the Cooper pair also is injected therein. FIG. 11E shows the density of states and the carrier distribution state in the i layer with the Cooper pair injected. Gaps $\Delta_2$ and $\Delta_3$ are made open in positions of the electron pseudo-Fermi level $E_{Fe}$ and hole pseudo-Fermi level $E_{Fh}$, respectively.

In turn, the following describes the relaxation process of the Cooper pair injected. As in the preceding example, if the Cooper pair which was stable in the n layer is injected into the conduction band of the i layer with the holes injected in the valence electron band of the i layer, then the electron and hole forming the Cooper pair recombine together to relax. There are three kinds of recombination process.

1. A recombination process of the Cooper pair in the conduction band with hole Cooper pair injected into the valence electron band at a time.

2. A recombination process of one electron forming the Cooper pair in the conduction band with one hole forming the hole Cooper pair injected in the valence electron band or quasi-particle hole in the valence band.

3. A recombination process of a quasi-particle electron in the conduction band with a hole injected in the valence electron band or quasi-particle hole in the valence band.

In the structure that the Cooper pair supply layer is provided on the both sides of nip junction, also, if the Cooper pair and hole Cooper pair radiate one photon to recombine, the energy of the photon is around two times the band gap Eg. It is different from the previous structure in that the densities of the states of the holes existing in the valence band changes and the densities of the states distribution particular to the superconductor are changed as shown in FIG. 11E with reflection by the injection of the Cooper pairs into the valence band. The forward bias current of the device oscillates at a constant voltage. Following this, the light emission intensity also oscillates at the same frequency and same phase. Relationships among the forward bias voltage V, current J, and light emission intensity I, like in the alternating current Josephson effect, are $J = J_c \sin(\phi_c - \phi_h)$ $2qV = h d(\phi_c - \phi_h)/dt$ $I \propto J$ where $\phi_c$ and $\phi_h$ are phases of the Cooper pair penetrated in the conduction band and valence band, respectively, h is a value of the Planck constant h divided by $2\pi$, and q is the elementary charge. If the device is driven by the constant voltage, the current oscillates at a frequency given by $v_v = 2qV/h$ The energies of the light radiated in the elementary process are the band gap Eg in the i layer semiconductor and $2_{Eg}$ which is twice of it. Let their frequencies be $v_{Eg}$ and $2v_{Eg}$. If the light emission intensity is modulated at a frequency $v_v$, the effectively radiated light is equivalent to the light including that of the fundamental frequency plus the ones of the following frequencies $vEg - v_v, vEg + v_v, 2v_{Eg} - v_v,$ $2v_{Eg} + v_v$ The frequencies of these satellite lights can be changed by the forward bias voltage V.

The new light emission phenomenon discovered in the present invention is essentially different from the alternating current Josephson effect. The alternating current Josephson effect is caused by the tunneling effect between two superconductors put on an insulator barrier. The new light emission of physical phenomenon, on the other hand, occurs between the Cooper pairs in the superconductized n type and p type semiconductors as if the band gap of the semiconductors can behave like the insulator. Particularly, the phenomenon is essentially new in that a light and electrical oscillation combined with the superconducting current appear as the light emission spectra can reflect the superconduction phase difference, $\phi_c - \phi_h$, of the superconductized semiconductor. Further, the following describes an example that the quantum structure is applied to the i layer. If a single quantum well is introduced in the i layer, the carrier distribution state and the density of states in the injection condition becomes the one shown in FIG. 11F. The state is different from the one in FIG. 11D in that a light emitting semiconductor layer 1104 in FIG. 11D is replaced by the quantum well formed of a semiconductor 1104-2 having a smaller band gap put between semiconductor 1104-1 and semiconductor 1104-3 having a larger band gap. As shown in FIG. 11G, as compared with the one in FIG. 11E, the density of states can change sharply by the quantum structure on the band edge side and by the superconducting gap on the pseudo-Fermi level side. The behavior of the Cooper pair injected in the structure is similar to the one described previously.

In view of application of the phenomenon mentioned above to optical devices, the semiconductor itself can be regarded as superconductor in the ranges of the penetrating length $\xi_s$ and injection length $\xi_r$. This can open the new way that a variety of superconducting devices using semiconductors, that is, superconductized semiconductor optical devices, can be accomplished. Particularly, the penetrating length $\xi_s$ can be controlled in a range of 1 nm to 700 nm by appropriately selecting the carrier concentration of the semiconductor, and the injection length $\xi_r$ can be controlled by the forward bias voltage. A variety of crystal structures, therefore, can be designed in the penetrating length $\xi_s$ of the Cooper pair into the semiconductor side so that the superconductized semiconductor optical devices of the new principle can be achieved, which could not be accomplished in the conventional semiconductor optical devices.

In addition, all the phenomena and techniques accomplished for the conventional semiconductor optical devices can be applied to the new devices. The new light emission phenomenon can be used to achieve light emitting diodes, laser diodes, and light receiving devices. All the techniques developed for high performance of the usual devices can be applied to the new devices.

The devices of the present invention described above are superconductized semiconductor optical devices which can behave as if the semiconductor can be superconductor by using the proximity effect of superconductor in the semiconductor having no superconduction characteristic originally. The technique of the present invention is fundamentally different from those of the Japanese Patent Laid-Open 63-30258 and the Japanese Patent Laid-Open 63-262882 in that this invention is based on an idea that a part of the semiconductor, having no superconduction characteristics originally or at any temperature, is converted to superconductor and is used for the optical devices by using the proximity effect, while the inventions of the Japanese Patent Laid-Open 63-302581 and the Japanese Patent Laid-Open 63-262882 is based on the idea that the Josephson junction itself of the superconductor is used.

Particularly, GaAs and silicon provide marked characteristics in the crystal completeness, no defects, no intergranularity, and the like as compared with the other materials, such as superconducting degenerate semiconductors mentioned above and insulators used in the conventional Josephson junction devices. The semiconductor, also, can be converted to superconductor by intervention of quality buffer metals used in the Si LSI and GaAs LSI, such as Au/Mo/WSi, and similar materials having no superconduction characteristic normally or even having it at an ultra low temperature. The present invention therefore cannot be lowered in the yield as in the usual Josephson junction devices such as the above-mentioned Josephson junction layers, due to intergrains or similar causes of superconducting metals. The device of the present invention, further, has a great advantage in use of the usual process technique of Si LSI and GaAs LSI and the device technique which have been advanced up to date in fabricating the devices.

Furthermore, the device of the present invention has an advantage that it can be easily integrated or combined with the existing Si device or GaAs (hetero) device.

In describing the present invention illustrated in the drawings, specific terminology will be resorted to for the sake of clarity. However, it is not intended to be limited to the specific terms so selected, and it is to be understood that each specific term includes all technical equivalents which operate in a similar manner to accomplish a similar purpose. That is, the present invention is not entirely limited to GaAs semiconductors, and of course for the light emitting devices the usual semiconductor materials for light emitting device can be used, including direct transition type semiconductors InGaAs, InGaAsP, GaSb, InP, ZnSe, ZnS, CdTe and the like. For the light receiving devices of the present invention non-direct transition type semiconductors can be achieved, such as Si and Ge, as well as the direct transition type semiconductors.

As described above, the superconductized semiconductor device according to the present invention can be formed in the S-I-S structure using the semiconductors, such as GaAs and Si, having a very high crystal characteristic and an extremely high controllability in the film thickness and impurity concentration. It therefore provides the following great advantages.

1. The S-I-S structure can be achieved using the semiconduction crystal so that it can completely overcome the defects, such as intergrains and pinholes, due to incompleteness of materials as in the conventional Josephson junction devices.

2. The heterojunction can be used to form insulating layer as in the heterojunction superconducting Josephson junction device so that the potential barrier of the insulating layer can be precisely determined in a range of m eV to 1 to 2 eV as desired. The film thickness of the insulating layer can be controlled using a crystal growing method, such as the one atomic layer controlled molecular beam epitaxial (MBE) technique or the organic metal heat decomposition method (MOCVD), which can control a single atom layer. It therefore can be formed uniform and accurate to a great extent in high reproducibility.

3. The Josephson junction can be formed using the heterojunction of AlGaAs/GaAs, or the like so that the Josephson current can be increased by one to two orders of magnitude without increasing the junction capacitance. This can remarkably increase the load drivability of the wire capacitance and the capacitance and resistance of the other devices in the LSI and increase the operational speed of the LSI.

4. The high Tc superconductor having higher Tc than around 100° K. can be used in the Cooper pair supply layer so that the LSI capable of operating stably at the liquid nitrogen temperature can be achieved.

5. It is possible to form the LSI and neuro-IC of very low power consumption and high speed using a negative resistance device.

The superconductized semiconductor device according to the present invention, as described above, can be formed as light emitting and receiving devices using the semiconductors, such as GaAs and Si, having a very high crystalline characteristic and an extremely high controllability in the film thickness and impurity concentration. It therefore can use all the conventional high performance techniques. It also provides the effects due to the superconductization. The effects are based on the following advantages involved in the present invention.

1. There is a process that all energy can be radiated by one photon in the course that the Cooper pair injected in the conduction band of the semiconductor is recombined with two holes injected in the valence band at a time. At the time, energy of 2Eg is radiated from the superconductized semiconductor of band gap Eg.

2. If the Cooper pair is injected in the both conduction band and valence electron band in operation of the semiconductor (laser) diode, the injection current and light emission intensity can oscillate at a constant voltage of operation. The oscillation behaves as in the alternating current Josephson effect. In this case, the bandgap of the semiconductor behaves like the insulator.

3. If the Cooper pair is injected in the band of the semiconductor, the superconducting gap can be made to open at a position of the Fermi level to limit the carrier distribution state. Decrease of the threshold current and narrowness of the spectrum width can be achieved.

4. The relaxation frequency can be made very high as reflecting the sharp state density.

5. All the parts formed of the semiconductors can be theoretically made by conventional semiconductor techniques. They therefore can be designed in a desired structure in a desired method. For various heterojunctions, quantum well structures, and modulation doping structure, the film thickness of the insulating layer can be controlled using a crystal growing method, such as the molecular beam epitaxial (MBE) technique or the organic metal heat decomposition method (MOCVD), which can control a single atom layer. It therefore can be formed uniform and accurate to a great extent in high reproducibility. The device techniques used for the conventional semiconductor lasers, such as wave guide path and resonator, are applicable. It is possible, for example, to use resonator constructions, such as the distributed feedback (DFB) laser and burled (BH) laser.

6. The superconductized semiconductor device according to the present invention can be easily formed in monolithic integration on the same substrate with the usual semiconductor devices, such as GaAs MESFET, two-dimensional electron gas FET (2DEGFET, HEMT), heterojunction FET, heterobipolar transistor, and 2DEGHBT, and optical devices, such as semiconductor laser, LED, and various light emitting and receiving devices. Although description was omitted above, the resonant tunneling structure of the semiconductor portions in FIG. 1C (FIG. 4C and the like described later) can be increased to double, triple, or more multi-well structure. It however is necessary to form the quantum well structure in the penetrating length $\xi s$ of the Cooper pair into the semiconductor side. The analysis method of the resonant tunneling structure of the Cooper pair, of course, is different from that of the resonant tunneling structure of the semiconductor.

In the examples described so far, the quantum well was of non-doped type, This is not always necessary, but it may be either of n type or p type combination. Doping allows easy penetrating of the Cooper pair. It should be noted that generally speaking the spectrum width is made wider in the light emission. For the electronic device, the non-linearity of the current-voltage characteristic may become weak in some cases.

Also, the superconductized semiconductor device according to the present invention can be easily formed in monolithic integration on the same substrate with the usual semiconductor devices, such as Si MOSFET, Si bipolar transistor, GaAs MESFET, 2DEGFETs (two-dimensional electron gas FET and HEMT), heterojunction FET, heterobipolar transistor, 2DEGHBT, and so on, and optical devices, such as semiconductor laser, LED, and light emitting and receiving devices.

Further, the superconductized semiconductor device according to the present invention can be implemented in the same device with the usual semiconductor devices for use in 2DEGHBT (for example, T. Usagawa et al., IEDM 87 Technical Digest, pp78–81, or the Japanese Patent Application 60-164128, the Japanese Patent Application 60-164126, and the Japanese Patent Application 61-40244), or a resonant tunneling FET (for example, A. R. Bonnefoi et al., IEEE Trans. Electron Devices, EDL-6 (1985), 636).

As in the manners described above, the superconductized semiconductor device according to the present invention can be formed in monolithic integration on the same semiconductor substrate as the Josephson junction devices in a broad sense having semiconductors of ultra high speed and low power consumption and their circuits and/or superconductized light emitting and receiving devices with the usual semiconductor devices, such as FET and bipolar, and their circuits (for example, see FIG. 1G).

The integration with the semiconductor devices can particularly contribute to performance increase of the ICs and LSIs, such as the 2DEGHBT, 2DEGFET, low temperature bipolar, and low temperature Bi-CMOS, at low temperatures, for example, liquid nitrogen temperature, at which thermal fluctuation of the superconductors does not affect thereto.

BRIEF DESCRIPTION OF THE DRAWINGS

Other objects and advantages of the present invention will further become apparent thereinafter and in the drawings in which:

FIGS. 10A and 10B are summarized graphs of experimental data of the proximity effect of the high Tc superconductor/semiconductor.

DETAILED DESCRIPTION

Figure 1A:
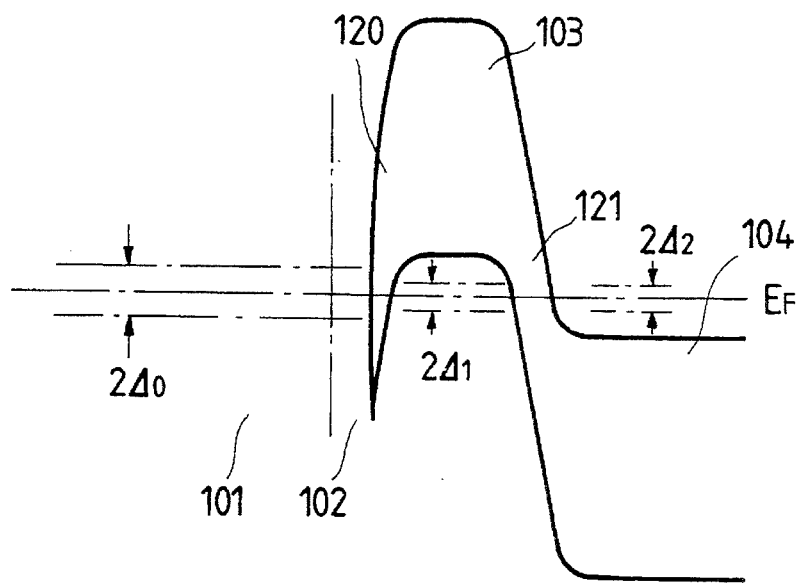
FIGS. 1A through 1G are illustrations explaining principles of the present invention.
Figure 1B:
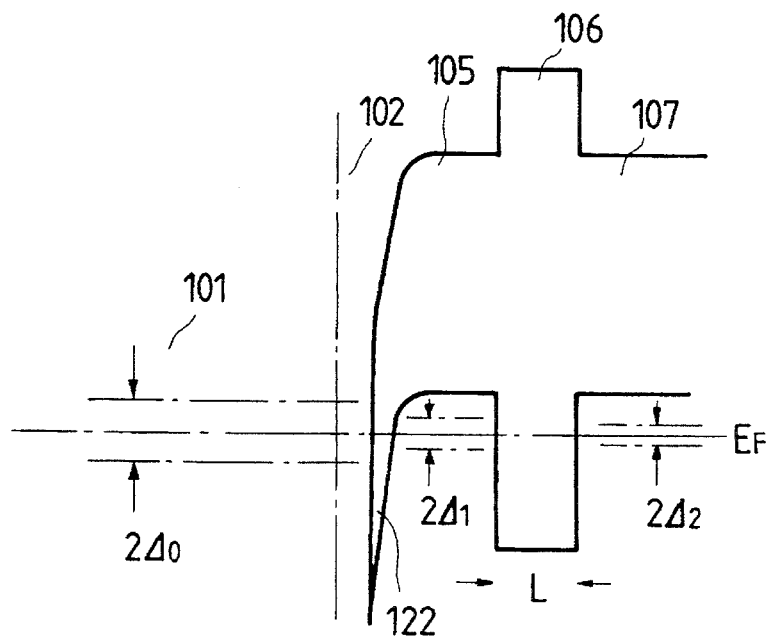
Figure 1C:
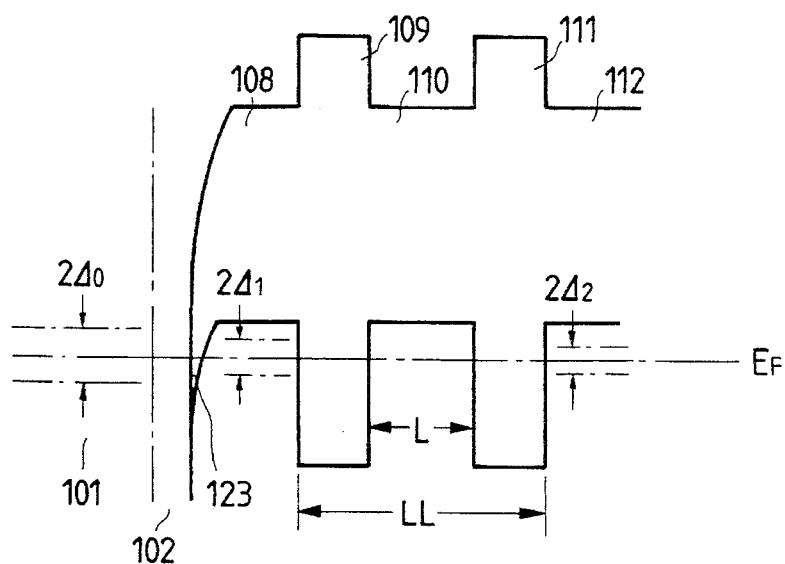
Figure 1D:
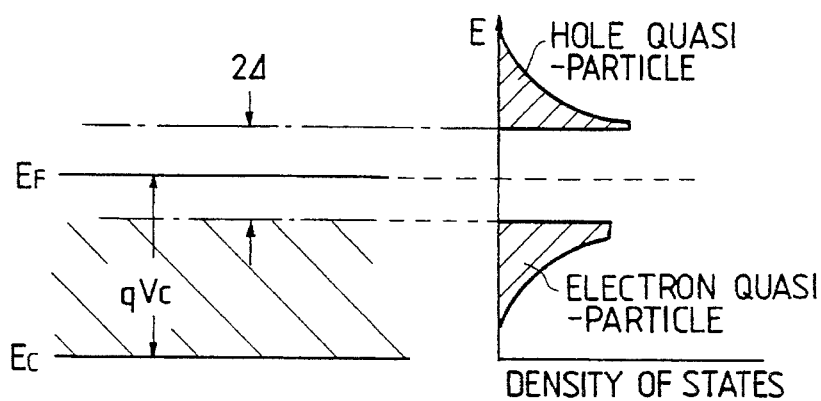
Figure 1E:
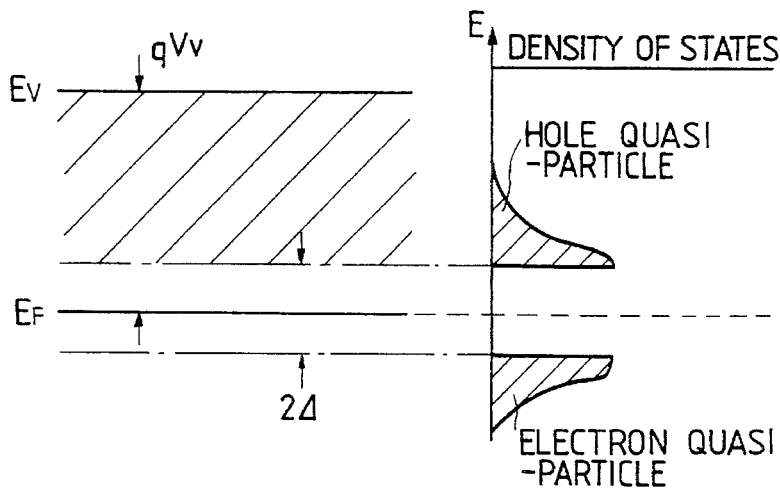
Figure 1F:
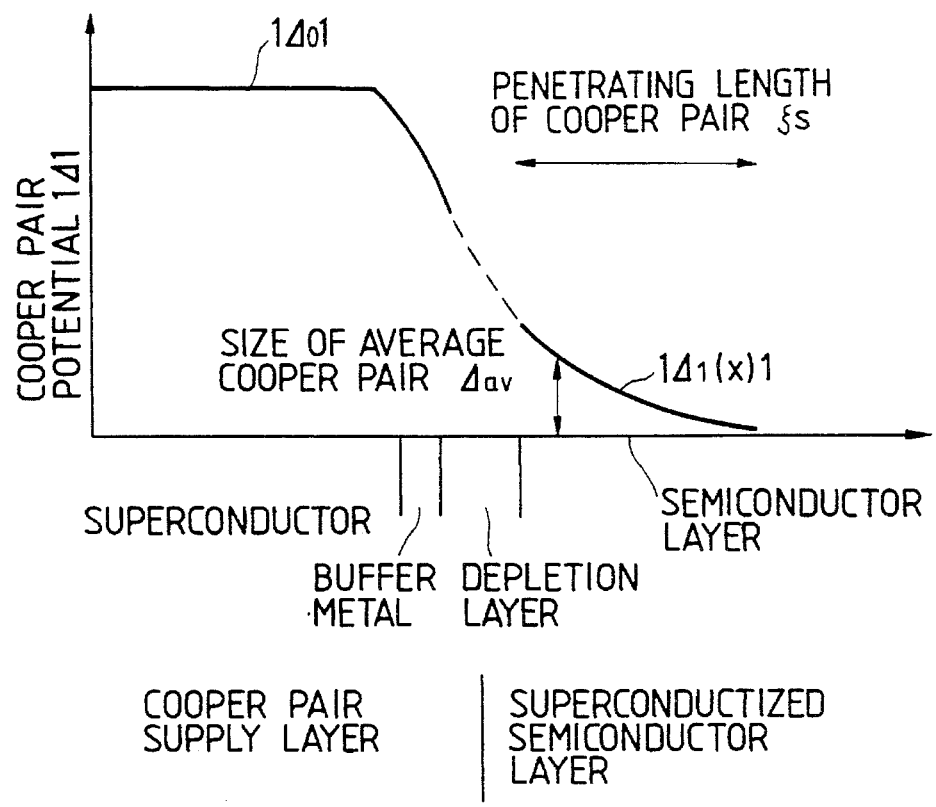
Figure 1G:
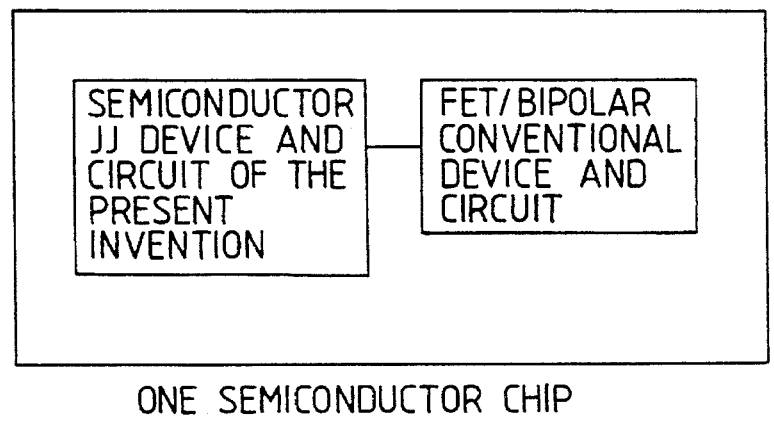
Figure 2A:
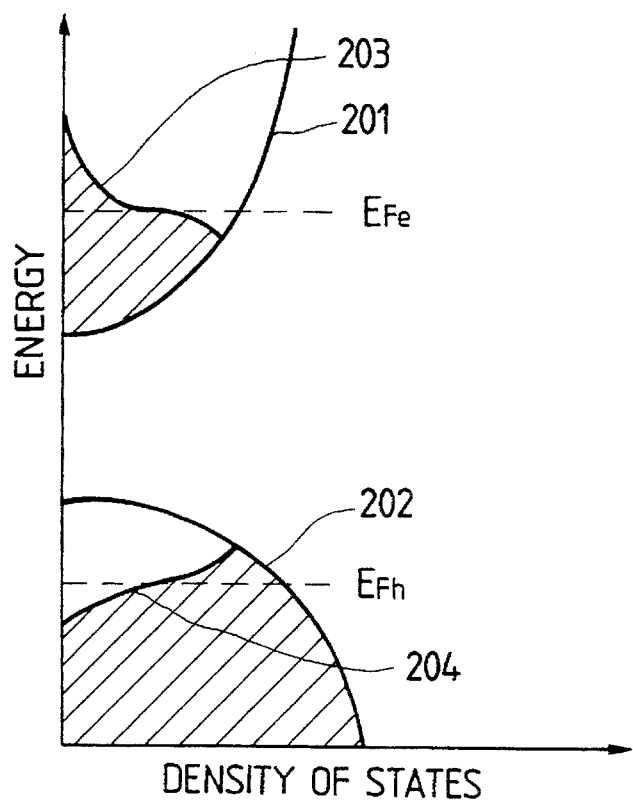
FIGS. 2A through 2D are energy-density of states diagrams showing sharpness of the densities of states in the usual quantum structure.
Figure 2B:
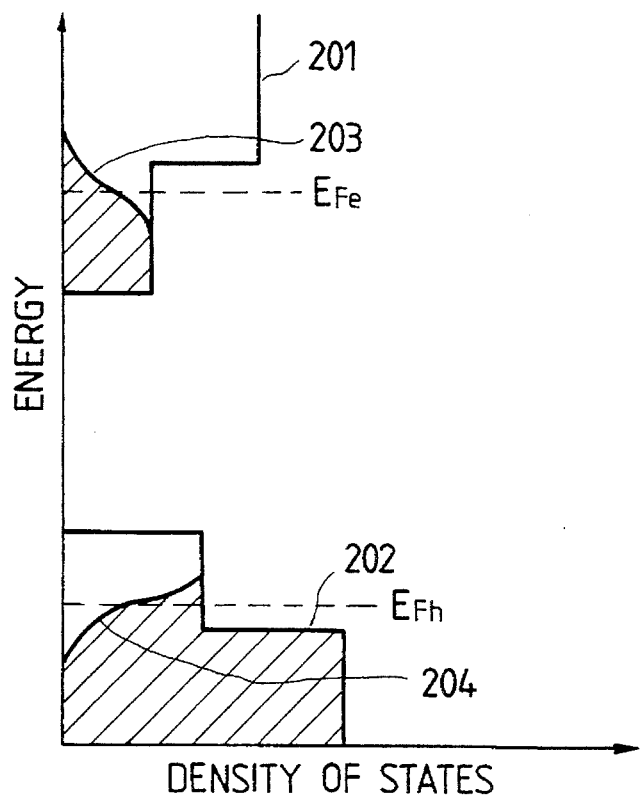
Figure 2C:
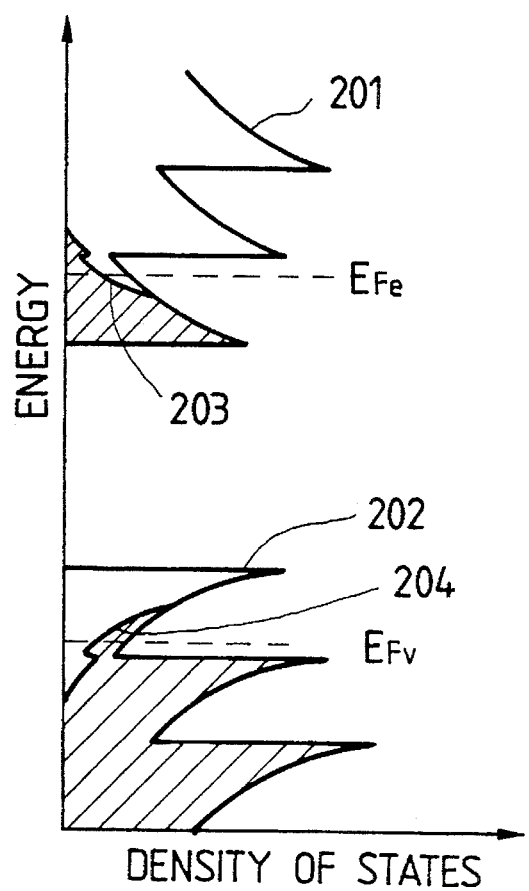
Figure 2D:
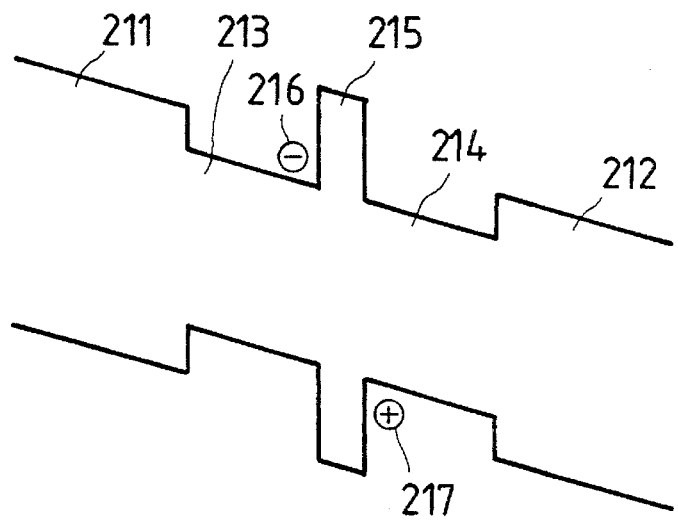

For the purpose of illustration only, the present invention will now be illustrated by the following embodiments. Of course, the present invention shall not be limited to the following embodiments.

In describing the preferred embodiment of the present invention illustrated in the drawings, specific terminology will be resorted to for the sake of clarity. However, it is not intended to be limited to the specific terms so selected, and it is to be understood that each specific term includes all technical equivalents which operate in a similar manner to accomplish a similar purpose.

Embodiment 1

Figure 5A:
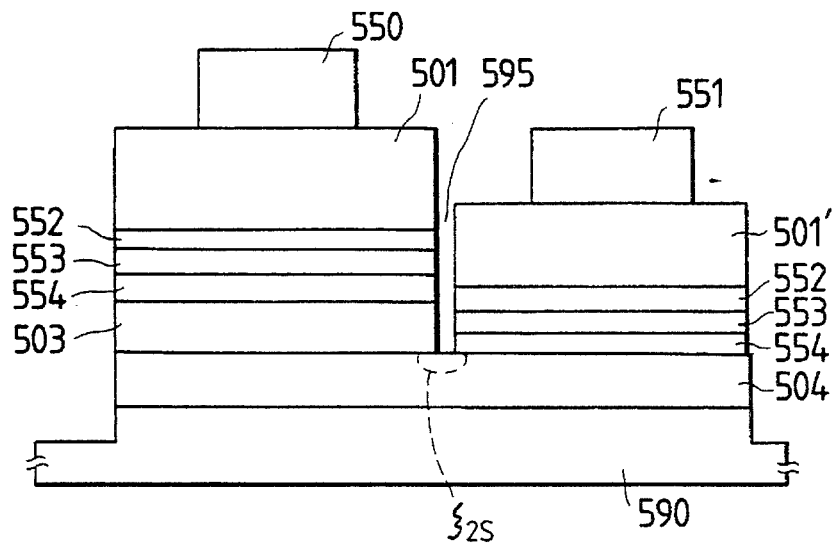
FIGS. 5A through 5F are the cross sectional views of the devices according to the present invention.

In the accompanying drawings, FIG. 5A is a cross sectional view of an embodiment of a superconducting Esaki diode of the present invention. Using the molecular beam epitaxial (MBE) technique, on a semi-insulating GaAs substrate 590, as shown in the figure, are formed a n$^+$GaAs layer 504 containing Si of $3\times10^{18}/cm^3$ to 300 nm thick, and a p$^+$As layer 503 containing Be of $1\times10^{20}/cm^3$ to 50 nm thick. After this, a diode pattern is formed in the layers using the existing conventional lithography and etching technique. In turn, the sputtering method is used to deposit onto the diode pattern WSi 554 to 30 nm thick, a Mo 553 to 30 nm thick, and an Au 552 to 80 nm thick as buffer metals. Further, the reactive evaporation is made to make onto it to form YBCO films 501 and 501' to 400 nm thick. In turn, electrode and element separations are made. Further, an Au of 300 nm thick is formed as diode lead electrodes 550 and 551.

A problem in such a forming process is a separation region 595 existing between the superconductor connections of the p$^+$GaAs layer 503 and of the n$^+$GaAs layer 504. The gap Ldd has the Cooper pair made from the proximate YBCO film 501', and further has the Cooper pair from the YBCO layer 501 through the p$^+$GaAS layer. If the gap Ldd is too much, the both proximity Cooper pairs cannot overlap thereon. The separation region 595 results in a finite parasitic resistance in the Josephson junction device of the present invention. The problem is the same as the case that either superconductor 501 or 501' is replaced by one usual superconductor. If the gap Ldd of the separation region 595 is narrower than the penetrating length or coherence length $\xi_2$s of the Cooper pairs into the n$^+$GaAs layer 504 from the both sides, the device can operate like the existing Josephson junction device. The specific contact resistance ρc of WSi to p$^+$GaAs of the concentration is around $3\times10^{-6}$ Ωcm$^2$. It will not change at the liquid nitrogen temperature and liquid helium temperature. In order to make the ohmic contact better, a carbon doped p++GaAs of $10^{21}/cm^3$ doping level is put in to 10 nm thick between the p+GaAs layer 503 and the buffer metal 554 using a MOMBE (gas source MBE) method or the like. The method can lower the specific contact resistance to $1 \times 10^{-8}$ $\Omega cm^2$ (for example, Usakawa et al., "A Study of Non-alloy Emitter Electrode of PNp type 2DEG-HBT", Shingakugihou (in Japanese), ED88-134, pp87-pp92, Jul. 19, 1989). In this case, the p+GaAs layer 503 is made to as thin as 10 nm.

In the embodiment mentioned above, the superconductor used is YBCO. In principle, it may be replaced by any of super conducting materials. These, for example, include high Tc superconductors, such as $Tl_2Ba_2Ca_2Cu_3O_{10}$ (hereinafter abbreviated the TBCCO) of 125° K. Tc, a $Bi_2Sr_2Ca_2Cu_3O_{10}$ (hereinafter abbreviated the BSCCO) of 115° K. Tc, and a $Nd_{185}Ce_{015}CuO_4$ (hereinafter abbreviated the NCCO) of 24° K. Tc, existing metal superconductor films, such as Nb, $Nb_3Ge$, $Nb_3Sn$, and Pb. In the embodiment is used the pn junction of GaAs for the device as an example, but of course similar devices can be accomplished using the pn junction of Si, InP and the like. The comments mentioned above apply to the following embodiments in which specific materials are used.

Embodiment 2

Figure 5B:
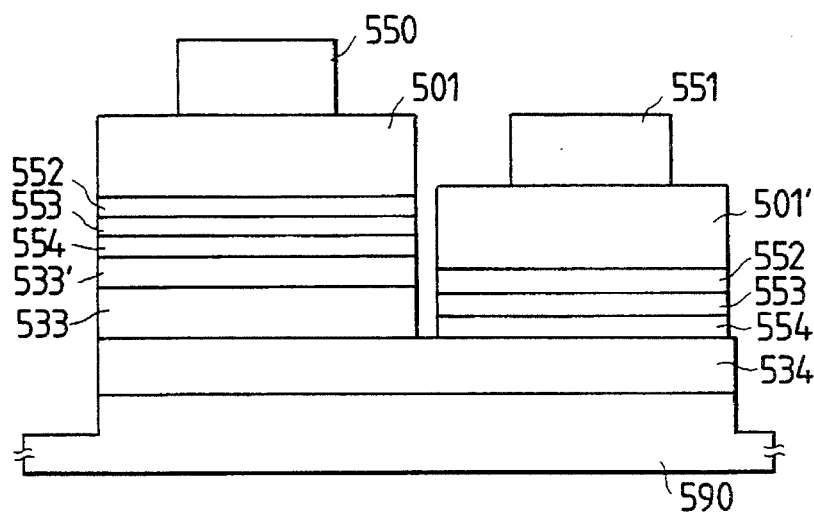

FIG. 5B is a cross sectional view of another embodiment of the superconducting Esaki diode of the present invention. The embodiment is described below, particularly in differences from the embodiment 1. Using the molecular beam epitaxial (MBE) technique, on the semi-insulating GaAs substrate 590, a p+GaAs layer 534 containing Be $1 \times 10^{20}/cm^3$ is made to grow to crystal of 500 nm thick at a low temperature of 500° C. without diffusion, a n+GaAs layer 533 containing Si of $3 \times 10^{18}/cm^3$ is formed to 40 nm thick, and a n++GaAs layer 533' containing Sn of $9 \times 10^{18}/cm^3$ is formed to 15 nm thick. After this, a diode is formed in a process similar to that of embodiment 1. In general, the n type GaAs does not easily become non-alloy ohmic. To make the ohmic contact better, the Sn doping layer 533' may be replaced by $n^+In_yGa_{1-x}As$ layer having a slanted In composition y as shown, for example, in T. Nittono et al., Japanese Journal of Applied Physics, Vol. 27, No. 9, pp1718-1722, September, 1988. Unlike T. Nittono et al., however, the inventors normally selected the thickness of InGaAs to around 15 nm. That is, the In composition is slanted in the 15 nm film. This can lower the specific contact resistance pc of the buffer metals and semiconductor layer to around $5 \times 10^{-9}$ $\Omega cm^2$, which can be designed so that the penetrating depth of the Cooper pair can reach the p type GaAs. The current-voltage characteristic is similar to that of embodiment 1.

Embodiment 3

Figure 5C:
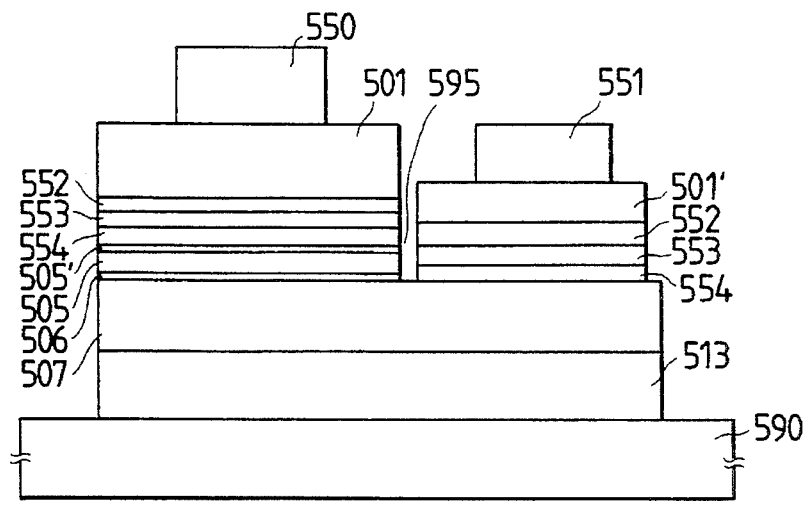

FIG. 5C is a cross sectional view of an embodiment of a hetero-junction superconducting Josephson junction device of the present invention. Using the molecular beam epitaxial (MBE) technique, on a semi-insulating GaAs substrate 590 are formed an undoped GaAs 513 of 400 nm thick, a p+GaAs layer 507 of 300 nm thick containing Be of $5 \times 10^{19}/cm^3$, an undoped $Al_xGa_{1-x}As$ 506 of 3 nm thick (x=0.45), a p+GaAs 505 of 40 nm thick containing Be of $5 \times 10^{19}/cm^3$, and a p+GaAs layer 505' containing Be of $1 \times 10^{20}/cm^3$. After this, a diode is formed in a similar way to that of embodiment 1.

It is possible to design the film thickness L of the undoped $Al_xGa_{1-x}As$ 506 (x=0.45) and the Al composition x so that the Josephson current $I_0$ can be made to a desired value. The film thickness L selected is in a range of 0.5 nm to 50 nm, and Al composition x selected is in a range of greater than 0 and at most 1.

In the embodiment, the Josephson current $I_0$ is $5 \times 10^4$ $A/cm^2$, which is as high as 1.5 digit times the usual Josephson junction device. The junction capacitance $C_o$ of the embodiment is 2.85 $\mu F/cm^2$, which is a similar amount to that of the existing metal Josephson junction device. The argument about the parasitic resistance is omitted here as it is the same as in embodiment 1.

Embodiment 4

Figure 5D:
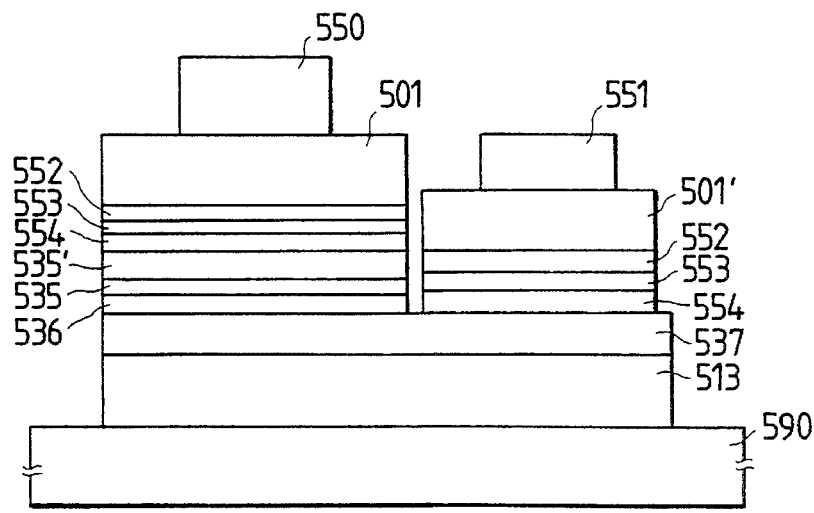

FIG. 5D is a cross sectional view of another embodiment of the heterojunction superconducting Josephson junction device of the present invention. The embodiment is described below, particularly in differences from the embodiment 3. Using the molecular beam epitaxial (MBE) technique, on a semi-insulating GaAs substrate 590 are formed an undoped GaAs 513 of 400 nm thick, a n+GaAs layer 537 of 300 nm thick containing Si of $4 \times 10^{18}/cm^3$, an undoped $Al_xGa_{1-x}As$ 536 of 1.5 nm thick (x=0.37, n+GaAs 535 of 40 nm thick containing Si of $4 \times 10^{18}/cm^3$, and $n^+In_yGa_{1-y}As$ layer 535' containing Si of $4 \times 10^{18}/cm^3$ with the In composition y slanted to be larger on the buffer metal side and smaller on the GaAs side. After this, a diode is formed in a similar way to that of embodiment 1.

It is possible to design the film thickness L of the undoped $Al_xGa_{1-x}As$ 536 (x=0.37) and the Al composition x so that the Josephson current $I_0$ can be desired value. This is the same as in the embodiment 3.

Embodiment 5

Figure 5E:
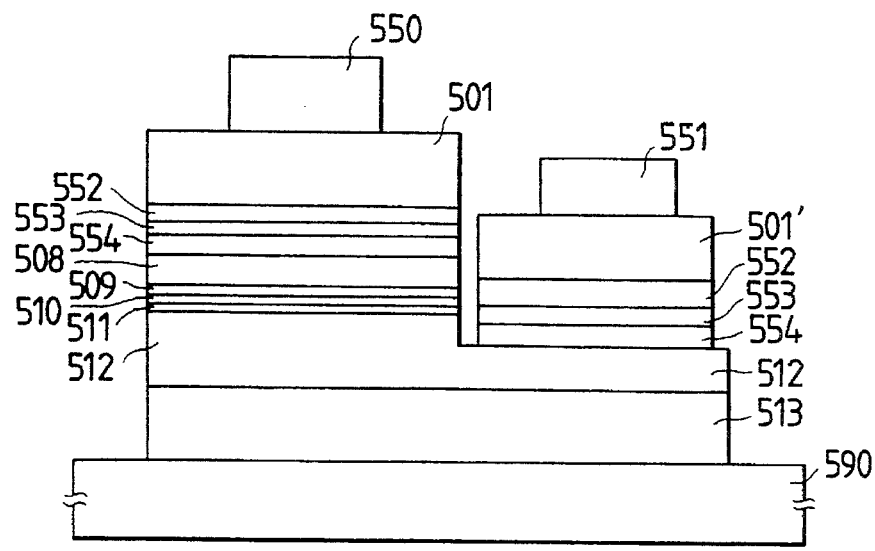

FIG. 5E is a cross sectional view of an embodiment of a resonant tunneling superconducting device of the present invention. Using the molecular beam epitaxial (MBE) technique, on a semi-insulating GaAs substrate 590 are formed an undoped GaAs 513 of 400 nm thick, a p+GaAs layer 512 of 300 nm thick containing Be of $5 \times 10^{19}/cm^3$, an undoped $Al_xGa_{1-x}As$ 511 of 1.0 nm thick (x=0.75), a p+GaAs 505 of 40 nm thick containing Be of $5 \times 10^{19}/cm^3$, an undoped GaAs 510 of 3 nm thick, an undoped $Al_xGa_{1-x}As$ 509 of 1.0 nm thick (x=0.75), and a p++GaAs layer 508 of 15 nm thick containing Be of $1 \times 10^{20}/cm^3$. After this, a diode is formed in a similar way that of embodiment 1.

It is possible to design the film thickness L of the undoped $Al_xGa_{1-x}As$ 509 and 511 (x=0.75) and the Al composition x so that the Josephson current $I_0$ can be made to a desired value. The film thickness selected is in a range of 0.5 nm to 50 nm, and Al composition x selected is in a range of greater than 0 and at most 1.

Figure 3A:
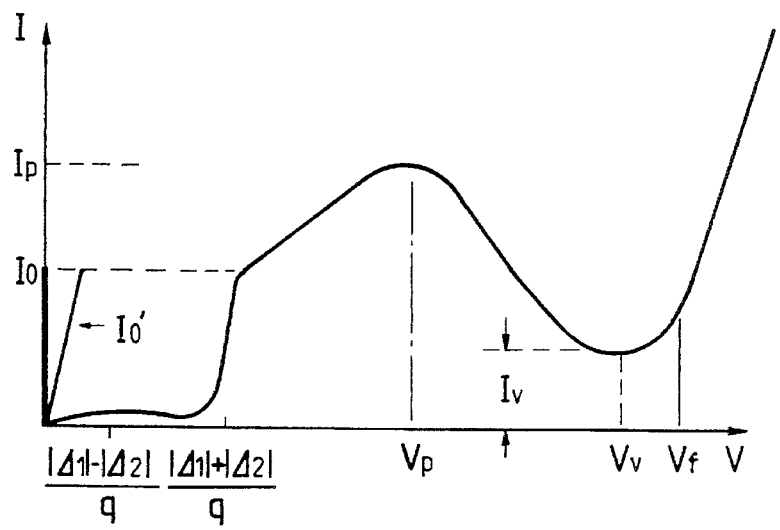
FIGS. 3A through 3E are the current-voltage characterisitics of devices according to the present invention and those of the usual Esaki diode.
Figure 3B:
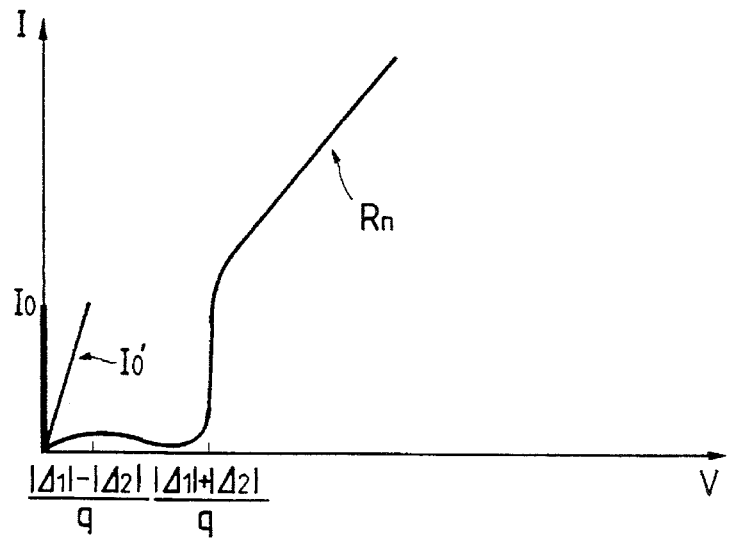
Figure 3C:
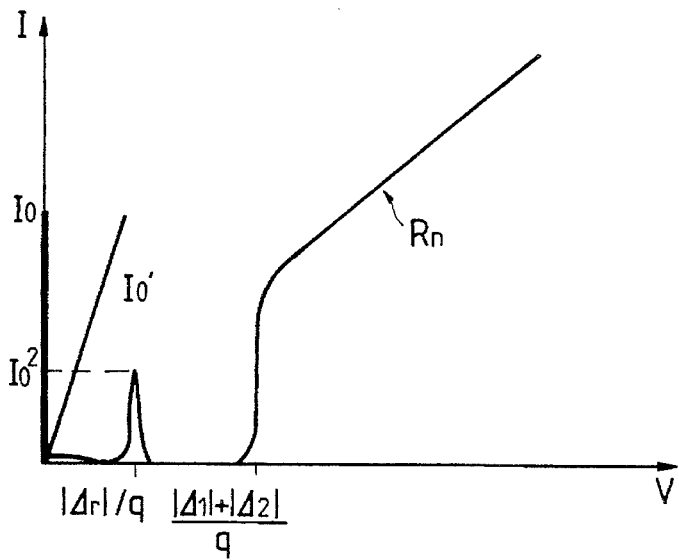
Figure 3D:
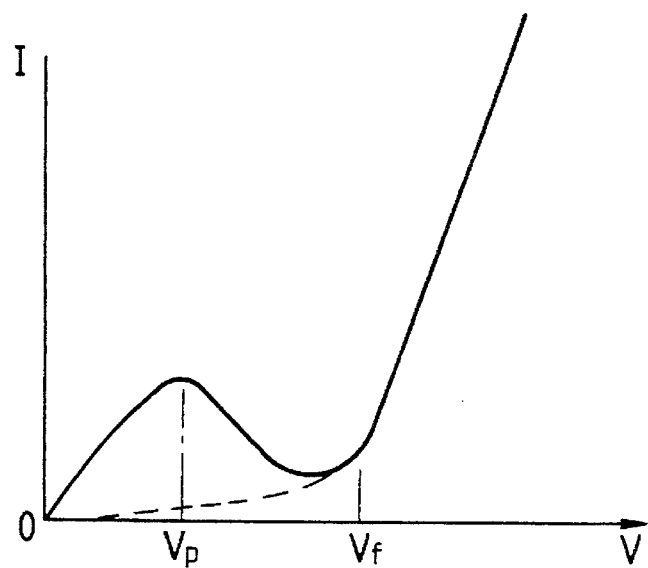
Figure 3E:
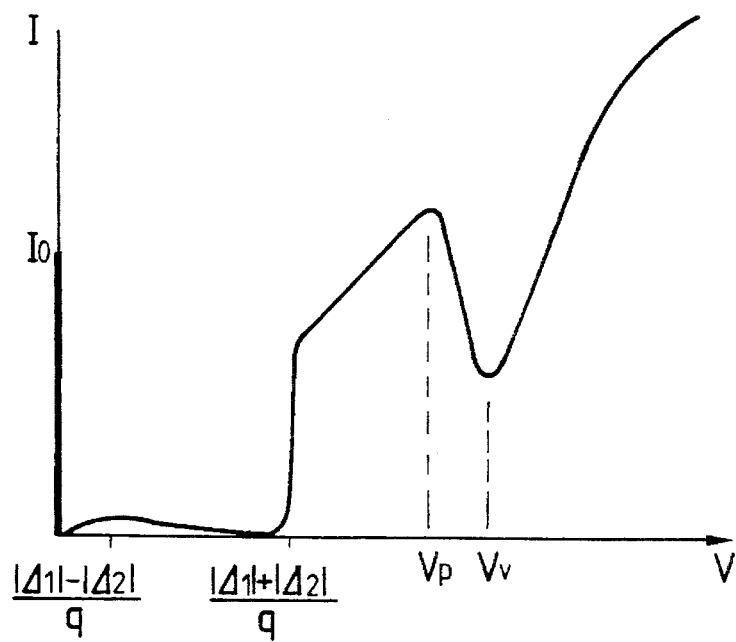
Figure 4A:
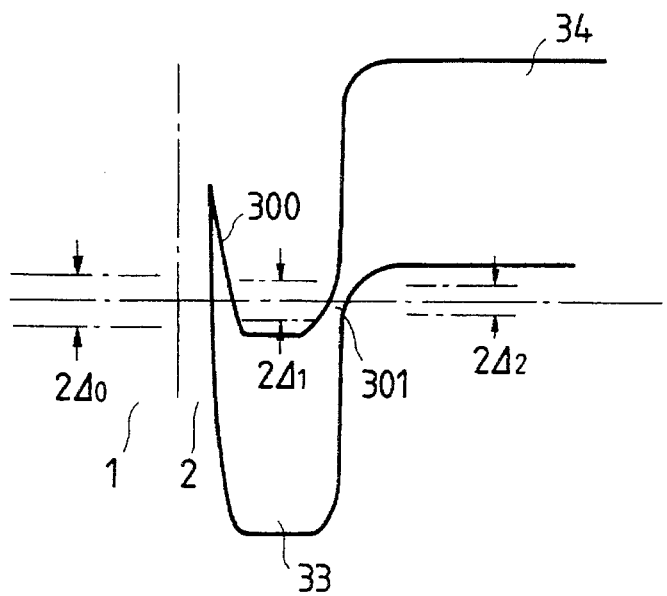
FIGS. 4A through 4C are energy band diagrams of other devices according to the present invention.
Figure 4B:
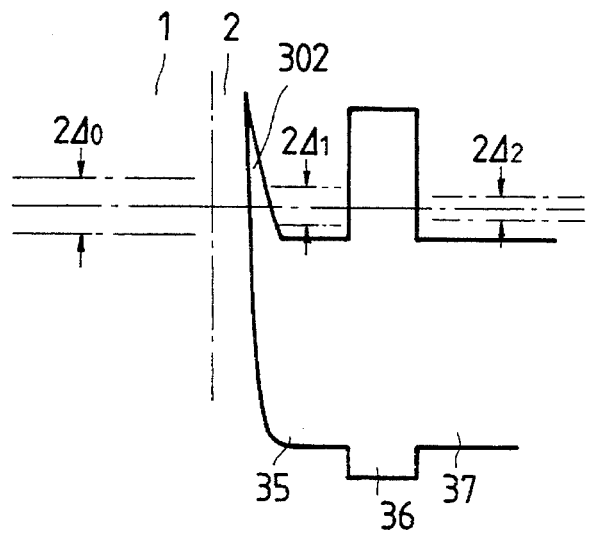
Figure 4C:
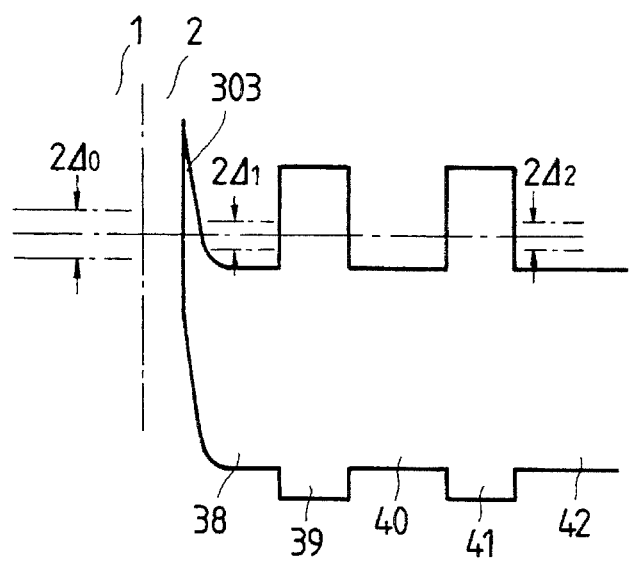

The current-voltage characteristic of the embodiment is shown in FIGS. 3C and 3E. If the resonance is at the ground state, two cases occur. One is that as shown in FIG. 3C, the superconducting current $I_02$ appears at the resonant energy $|\Delta_r|$ in the region within the sum of the superconducting gap $|\Delta_1|+|\Delta_2|$ which was inhibited in view of energy. The other is that as shown in FIG. 3E, a negative resistance appears as a result of resonance of a quasi-particle. In the latter case, Vp corresponds to the resonant energy of the quasi-particle. As explained above, the degenerate semiconductor that is superconductized to put the quantum well in causes a new phenomenon, that is the resonance of the ground state itself.

This can obtain current-voltage characteristic unfamiliar to the existing Josephson junction devices. It is easy to understand the resonant tunneling phenomenon of the quasi-particle as it is a one-body problem as in the usual resonant tunnel diode. Between the both cases different positions of the resonant levels are formed in the quantum well. The results of FIGS. 3C and 3E may be overlapped depending on actual positions as observed.

Embodiment 6

Figure 5F:
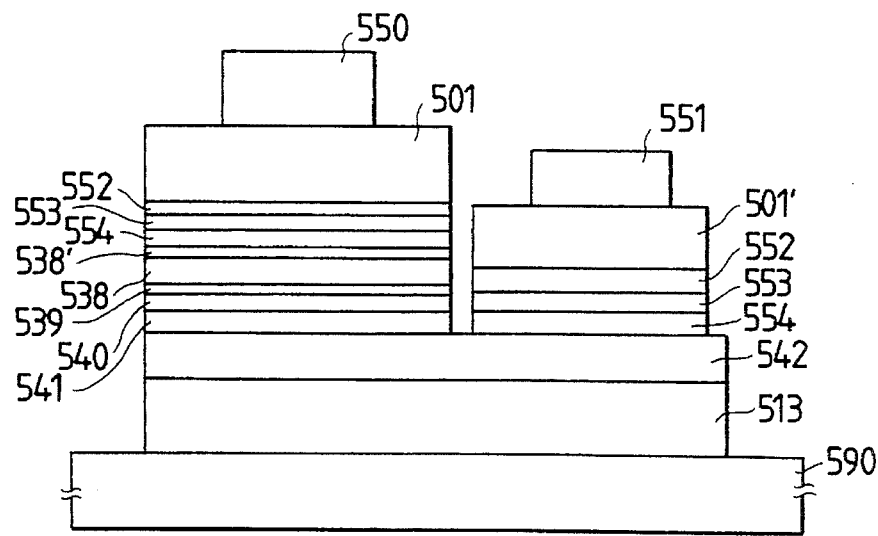

FIG. 5F is a cross sectional view of another embodiment of the resonant tunneling superconducting device of the present invention. Using the molecular beam epitaxial (MBE) technique, on a semi-insulating GaAs substrate 590 are formed an undoped GaAs 513 of 400 nm thick, a n$^+$GaAs layer 542 of 300 nm thick containing Si of $4 \times 10^{18}/cm^3$, an undoped Al$_x$Ga$_{1-x}$As 541 of 1.5 nm thick (x=0.45), an undoped GaAs 540 of 3 nm thick, an undoped Al$_x$Ga$_{1-x}$As 539 of 1.5 nm thick (x=0.45), a n$^+$GaAs layer 538 of 25 nm thick containing Si of $4 \times 10^{18}/cm^3$, and a n$^+$GaAs layer 538 of 25 nm thick containing Si of $4 \times 10^{18}/cm^3$ and a n$^+$GaAs layer 538' of 15 nm thick containing Sn of $1 \times 10^{19}/cm^3$. After this, a diode is formed in a similar way to that of embodiment 1.

It is possible to design the film thickness L of the undoped Al$_x$Ga$_{1-x}$As 539 and 541 (x=0.45) and the Al composition x so that the Josephson current I$_0$ can be made to a desired value. The film thickness L selected is in a range of 0.5 nm to 50 nm, and Al composition x selected is in a range of greater than 0 and at most 1. The argument about the current-voltage characteristic is omitted here as it is the same as in embodiment 5.

Embodiment 7

Figure 6A:
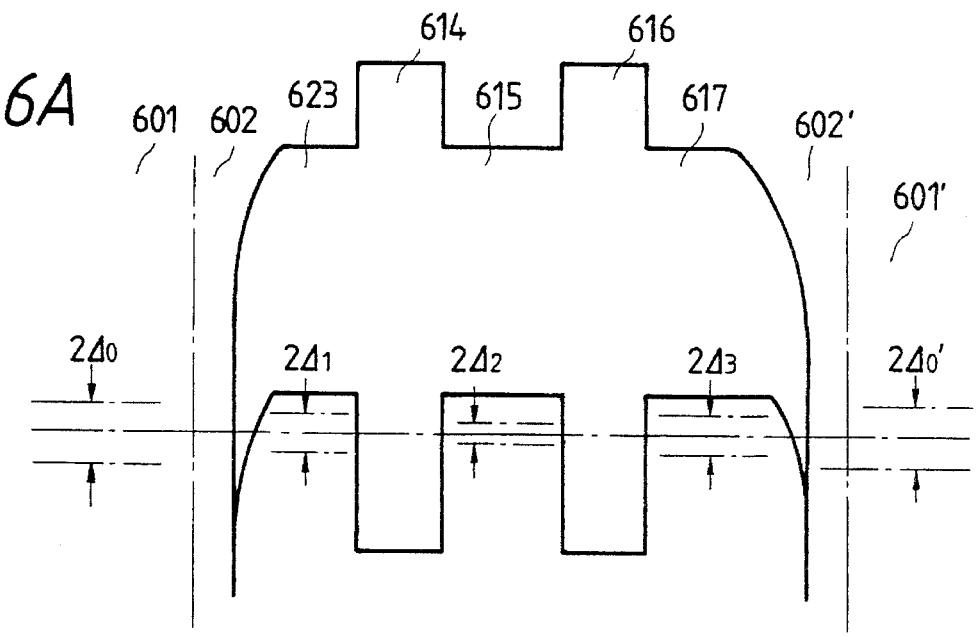
FIGS. 6A through 6G are energy band diagrams, cross sectional views, and current-voltage characteristic of another device according to the present invention.
Figure 6B:
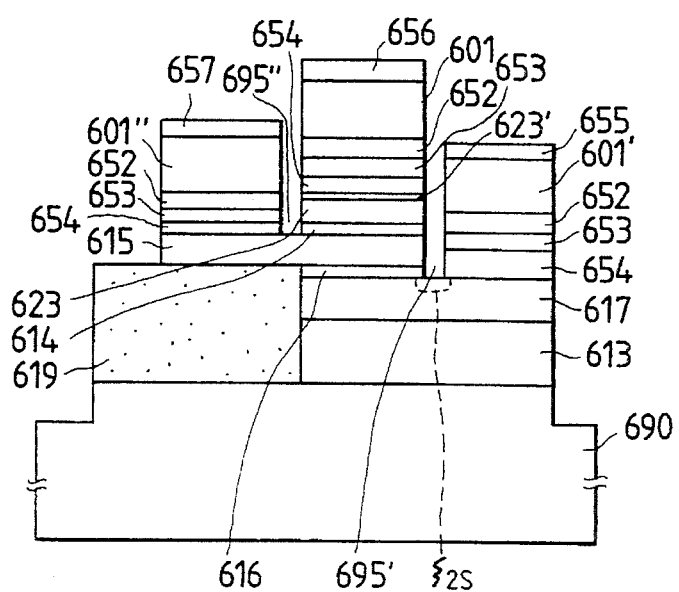

FIGS. 6A and 6B are an energy band diagram and cross sectional view of an embodiment of a hot Cooper pair transistor, respectively, of the present invention. The following describes major parts of the transistor. Crystal structure of the transistor is formed using the molecular beam epitaxial (MBE) technique. On a semi-insulating GaAs substrate 690 are formed an undoped GaAs 613 of 400 nm thick, a p$^+$GaAs layer 617 of 300 nm thick containing Be of $5 \times 10^{19}/cm^3$, an undoped Al$_x$Ga$_{1-x}$As 616 of 2.0 nm thick (x=0.75), a p$^+$GaAs layer 615 of 50 nm thick containing Be of $5 \times 10^{19}/cm^3$, an undoped Al$_x$Ga$_{1-x}$As 614 of 2.5 nm thick (x=0.75), a p$^+$GaAs layer 623 of 50 nm thick containing Be of $5 \times 10^{19}/cm^3$, and a p$^+$GaAs layer 623' of 10 nm thick containing Be of $1 \times 10^{20}/cm^3$. Using the conventional semiconductor process, buffer metals 652, 653, and 654 and High Tc superconductors 601, 601', and 601" are formed in the emitter, base, and collector areas, respectively, as in the embodiment 1. Separation is made between the elements to form gaps 695' and 695". Ag is deposited to form an emitter electrode 656, a base electrode 657, and a collector electrode 655. As parasitic capacitance reducing layer is immersed in proton or oxygen to form a semiconductor layer 619.

It is possible to design the film thickness L of the undoped Al$_x$Ga$_{1-x}$As 614 and 616 (x=0.75) and the Al composition x so that the Josephson current I$_0$ can be made to a desired value. The film thickness selected is in a range of 0.5 nm to 50 nm, and Al composition x selected is in a range of greater than 0 and at most 1.

Figure 6C:
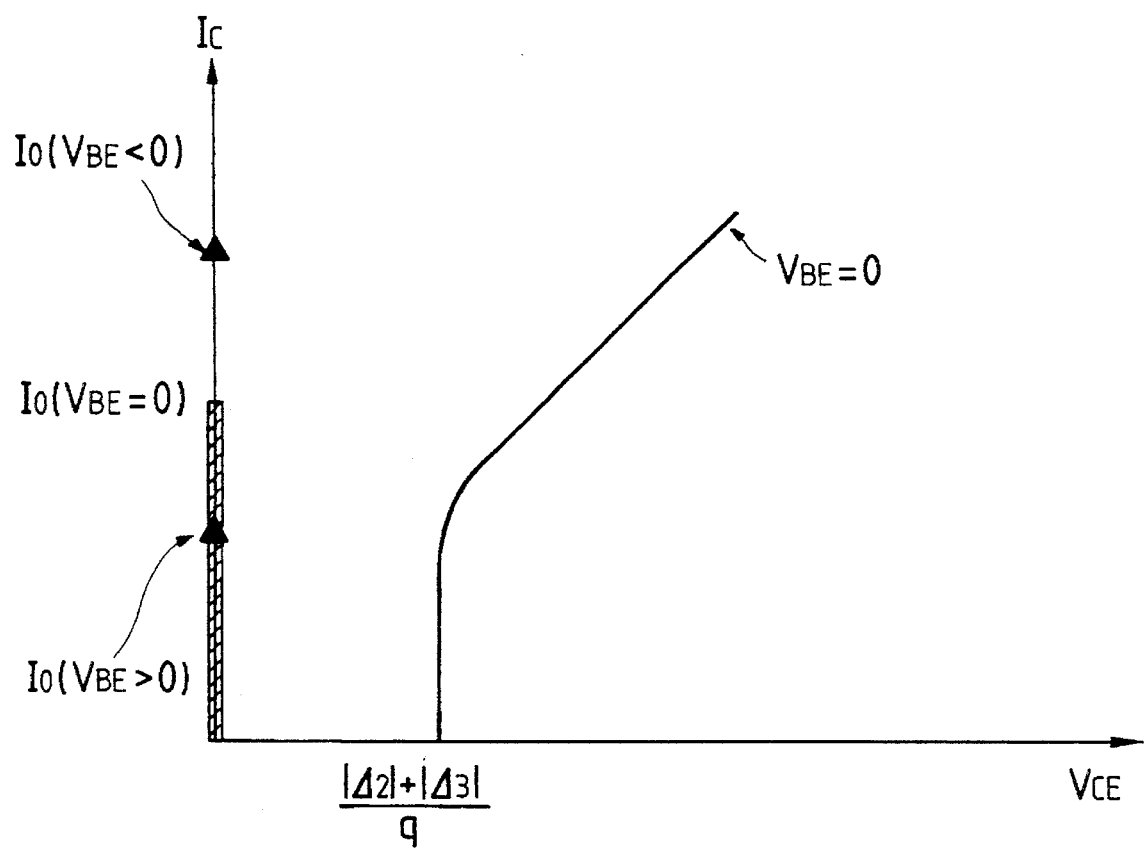

A principle of the transistor is featured in that a base potential V$_{BE}$ which is assumed positive for positive emitter potential with respect to the base can control a Josephson current I$_0$ (V$_{BE}$) flowing from the emitter to the collector. FIG. 6C shows a current-voltage characteristic which is the collector current I$_C$ with respect to a voltage V$_{CE}$ between the collector and the emitter.

Embodiment 8

Figure 6D:
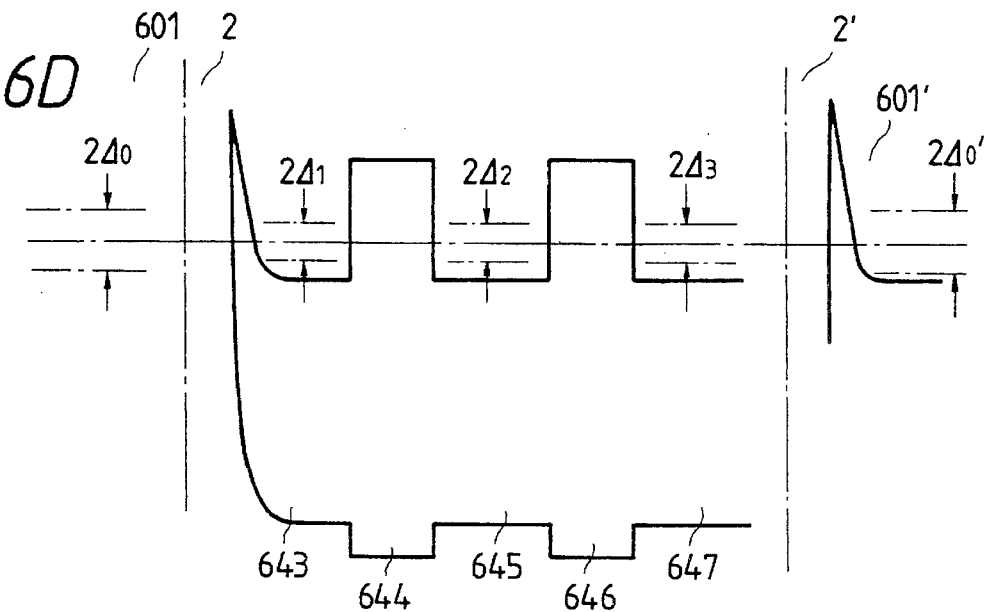
Figure 6E:
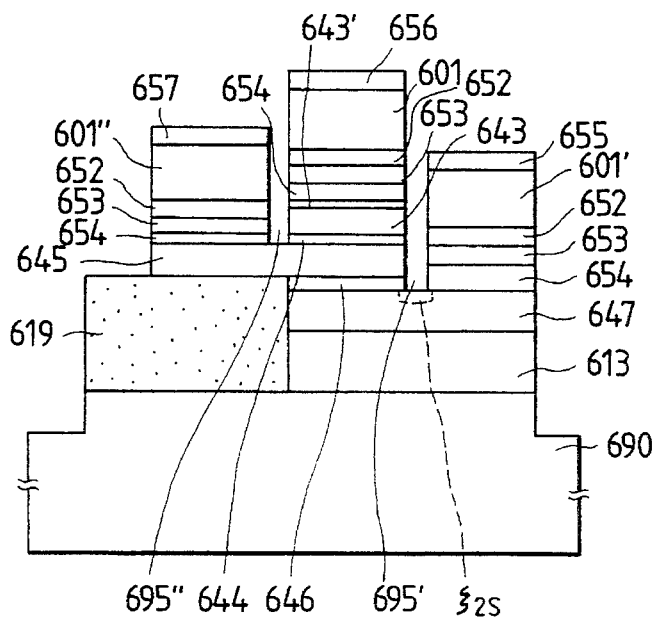

FIGS. 6D and 6E are an energy band diagram and cross sectional view of another embodiment of the hot Cooper pair transistor, respectively, of the present invention. Using the molecular beam epitaxial (MBE) technique, on a semi-insulating GaAs substrate 690 are formed an undoped GaAs 613 of 400 nm thick, a n$^+$GaAs layer 647 of 300 nm thick containing Si of $4 \times 10^{18}/cm^3$, an undoped Al$_x$Ga$_{1-x}$As 646 of 1.5 nm thick (x=0.45), an undoped n$^+$GaAs layer 645 of 30 nm thick containing Si of $4 \times 10^{18}/cm^3$, an undoped Al$_x$Ga$_{1-x}$As 644 of 1.5 nm thick (x=0.45), a n$^+$GaAs layer 643 of 25 nm thick containing Si of $4 \times 10^{18}/cm^3$, and a n$^+$GaAs layer 643' of 15 nm thick containing Si of $1 \times 10^{19}/cm^3$. After this, using the usual semiconductor process as in embodiment 7, the transistor is formed.

A principle of the transistor is same as in embodiment 7.

Embodiment 9

Figure 6F:
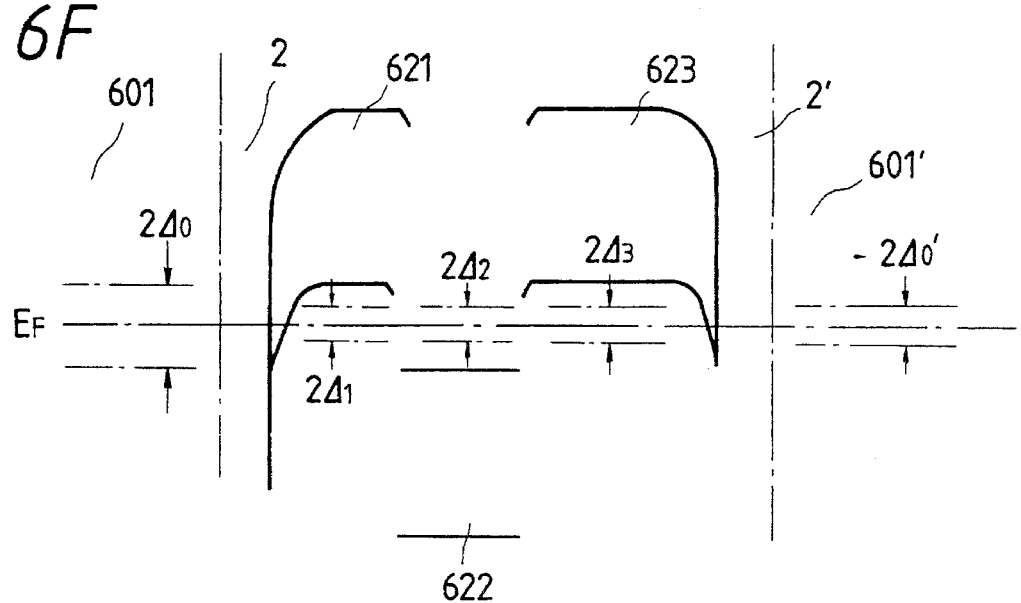
Figure 6G:
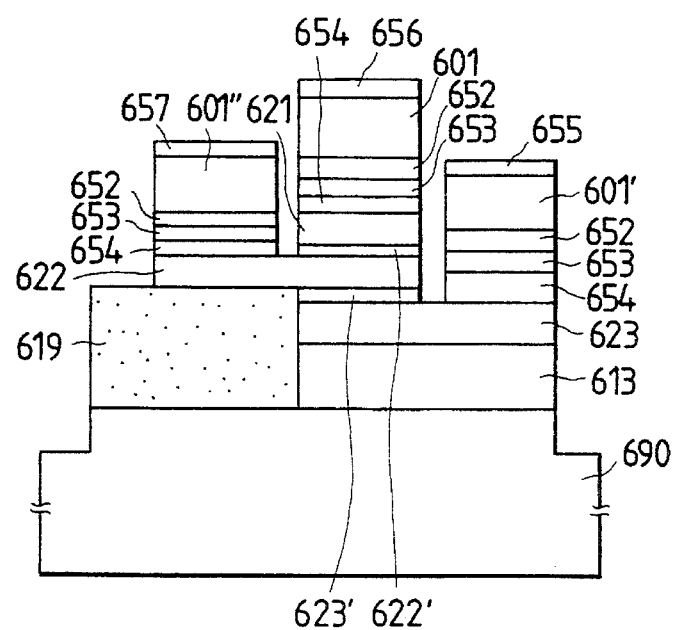

FIGS. 6F and 6G are an energy band diagram and cross sectional view of another embodiment of the hot Cooper pair transistor, respectively, of the present invention. A heterojunction of semiconductor is known as in GaSb/InAs, for example, where a valence band of GaSb is above a conduction band of InAs (see, for example, L. L. Chang et al., Appl. Phys. Lett., 35 (1979), pp939–943). The following describes major parts of the transistor. Crystal structure of the transistor is formed using the molecular beam epitaxial (MBE) technique. On a semi-insulating GaAs substrate 690 are formed an undoped GaAs 613 of 400 nm thick, a p$^+$GaSb layer 623 of 300 nm thick containing Be of $5 \times 10^{19}/cm^3$, an undoped GaSb layer 623' of 2.0 nm thick, a n$^+$InAs layer 622 of 20 nm thick containing Si of $4 \times 10^{18}/cm^3$, and an undoped InAs 622' of 2.0 nm thick, a p$^+$GaSb layer 621 of 30 nm thick containing Be of $5 \times 10^{19}/cm^3$. The other process steps are same as in embodiment 8.

The transistor is featured in that electrons which are fully filled in the valence band of the emitter can easily move into the conduction band of InAs. This means that the Josephson current can be controlled more easily. Although the transistor described above is of pnp type, it can be similarly devised of npn type by arranging GaSb and InAs reversely.

Embodiment 10

Figure 7A:
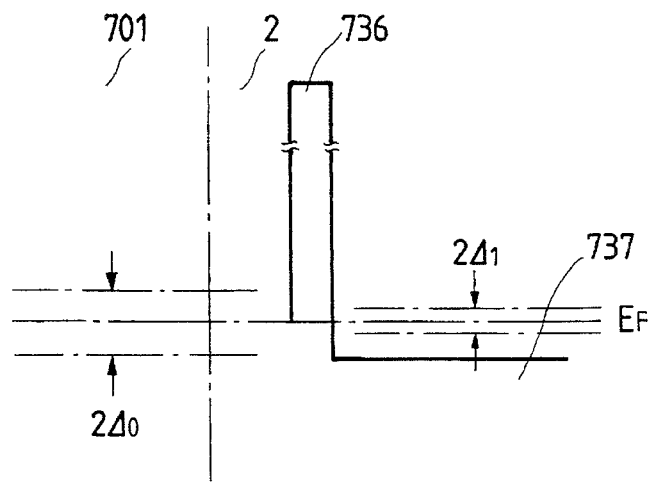
FIGS. 7A and 7B are an energy band diagram and cross sectional view of another device according to the present invention.
Figure 7B:
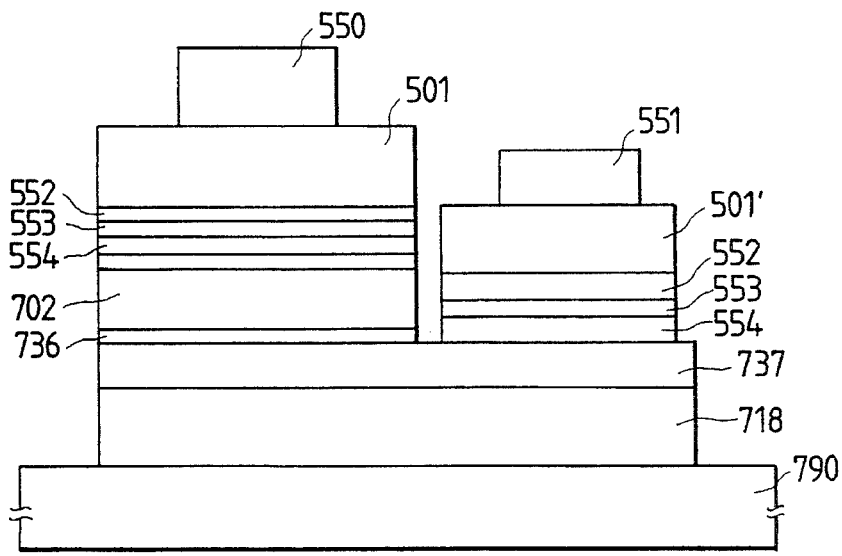

FIGS. 7A and 7B are an energy band diagram and cross sectional view of another embodiment of the heterojunction superconducting Josephson junction device of the present invention. The following describes it, particularly in differences from embodiment 4. Using the molecular beam epitaxial (MBE) technique, on a p type Si substrate 790 are formed a highly pure p$^-$Si 718 of 200 nm thick, a n$^+$Si layer 737 containing As of $4 \times 10^{20}/cm^3$, a thermally oxidized SiO$_2$ 736 of 0.5 nm, and a polysilicon 702 of 30 nm containing As of $4 \times 10^{20}/cm^3$. After this, a diode is formed in a similar way to that of embodiment 1. Although it is defective in that it is difficult to make the film thickness of SiO$_2$ uniform, the device can be recognized in a sense as device extended from the heterojunction superconducting Josephson junction device.

Embodiment 11

Figure 8A:
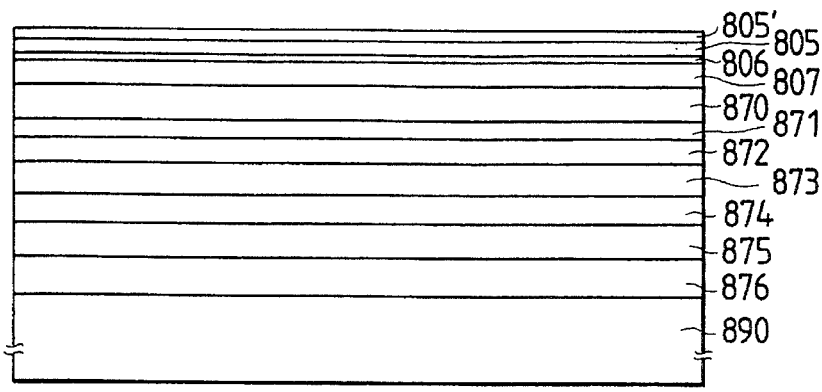
FIGS. 8A through 8C are energy band diagram and cross sectional views of another device according to the present invention.
Figure 8B:
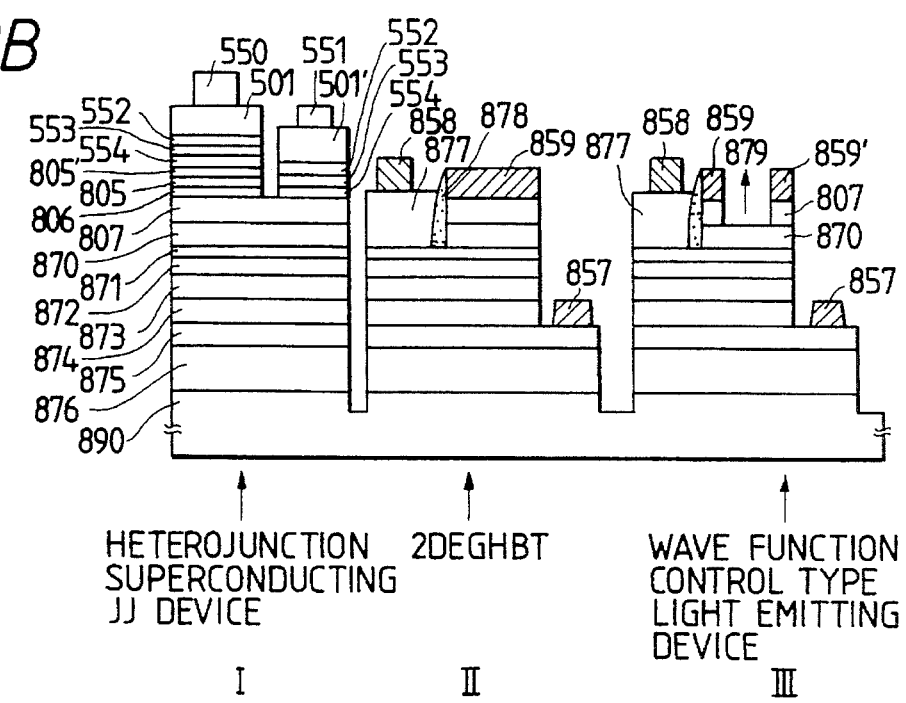
Figure 8C:
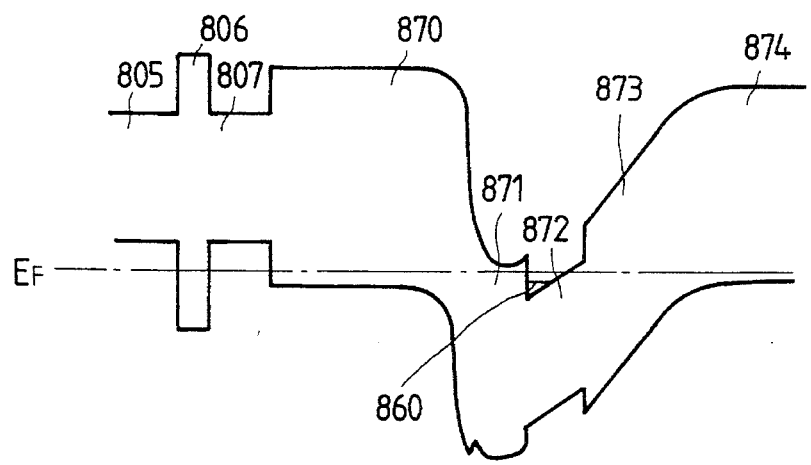
Figure 9:
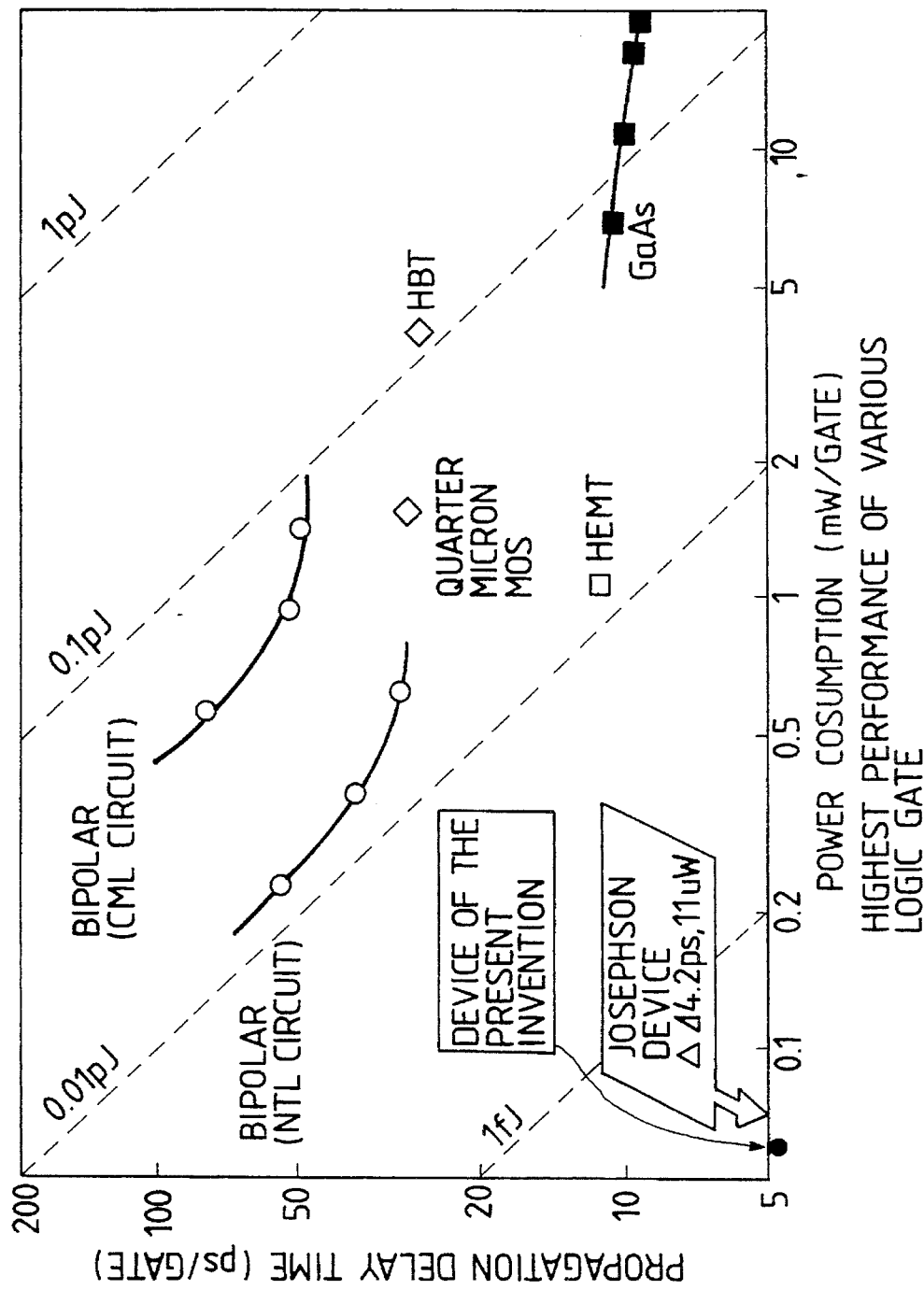
FIG. 9 is a diagram illustrating a position of the device according to the present invention.
Figure 10A:
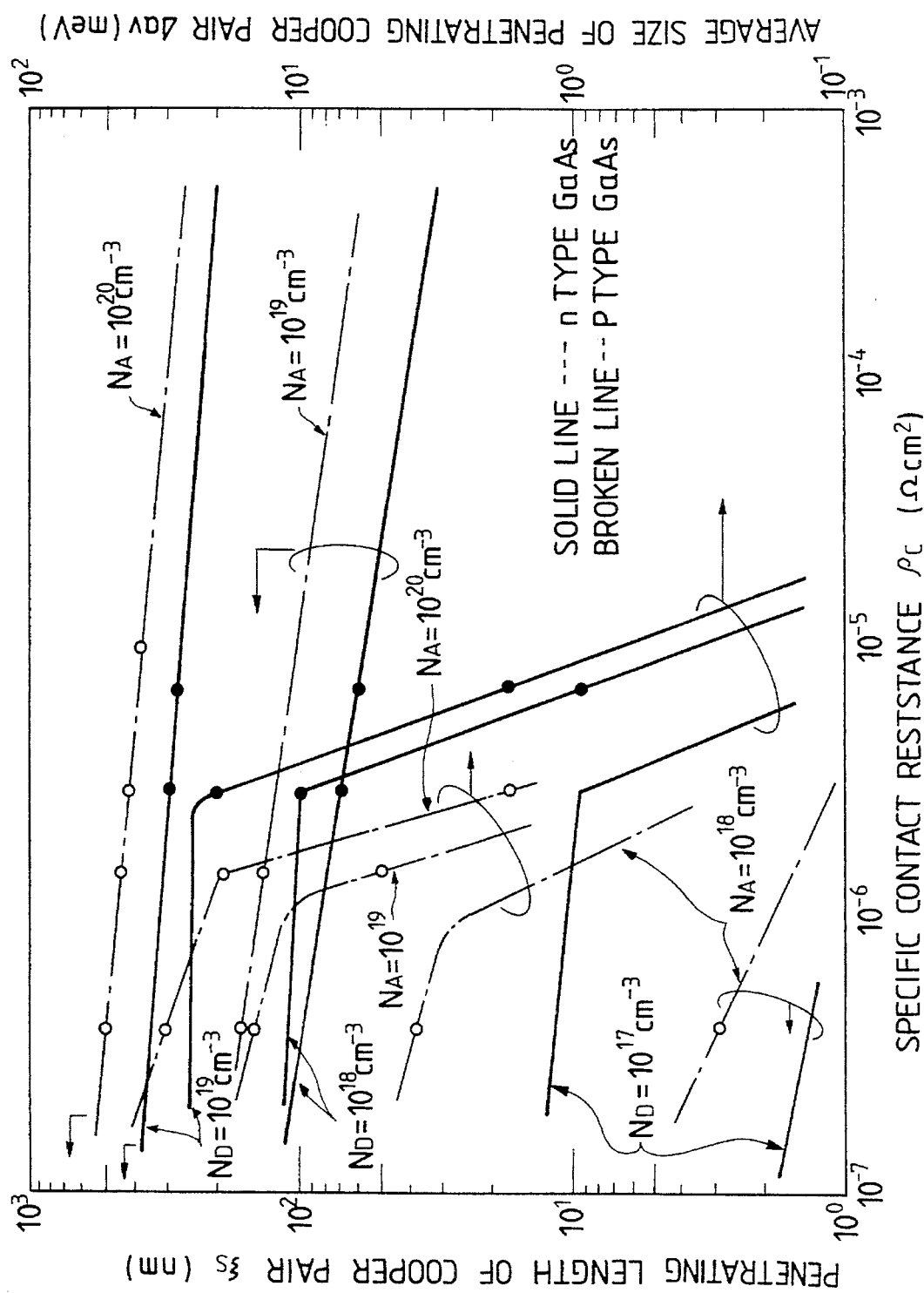
Figure 11A:
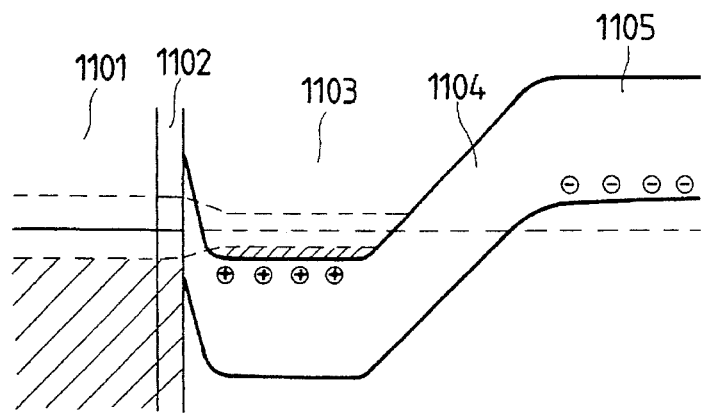
FIGS. 11A through 11G are illustrations for explaining the operational principles of an optical device according to the present invention.
Figure 11B:
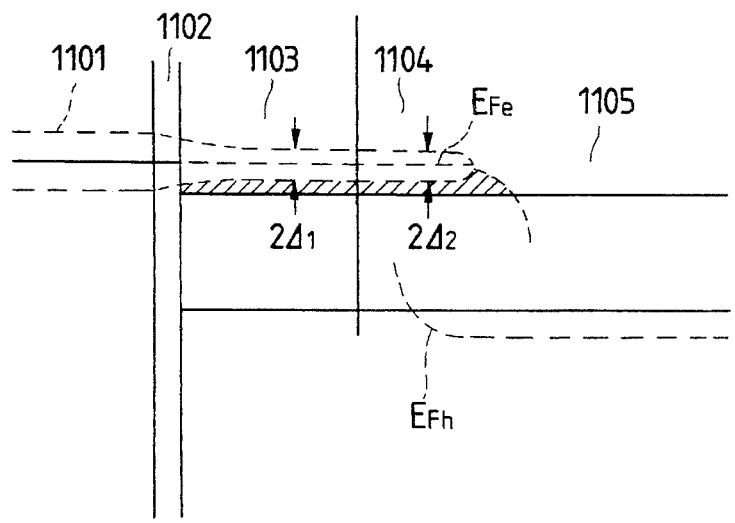
Figure 11C:
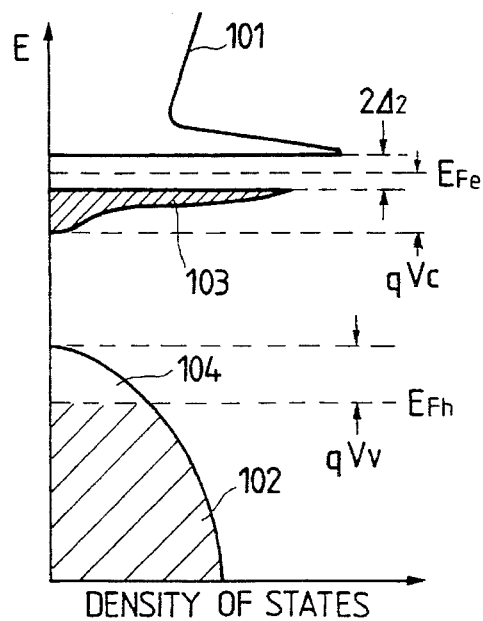
Figure 11D:
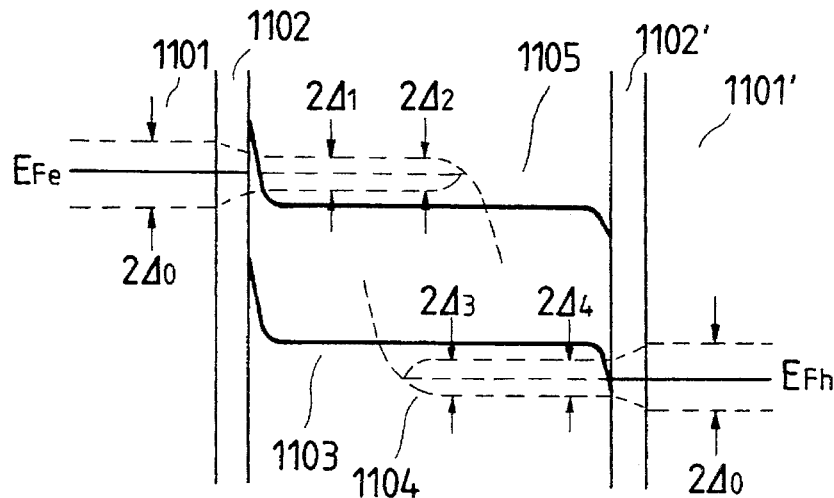
Figure 11E:
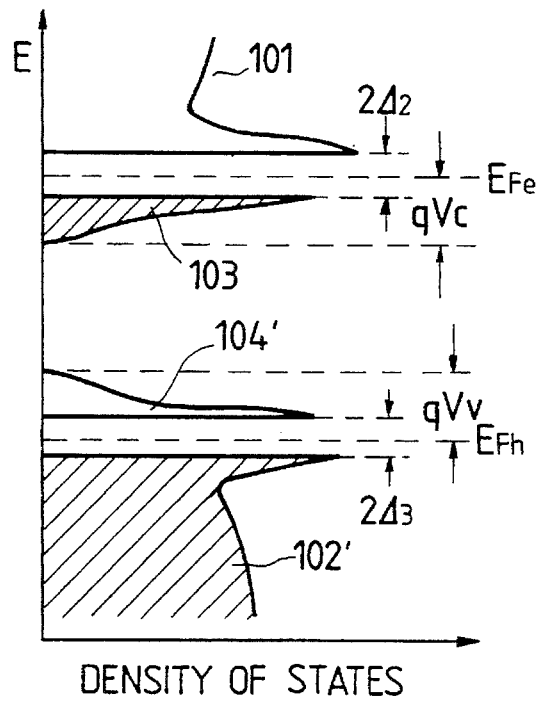
Figure 11F:
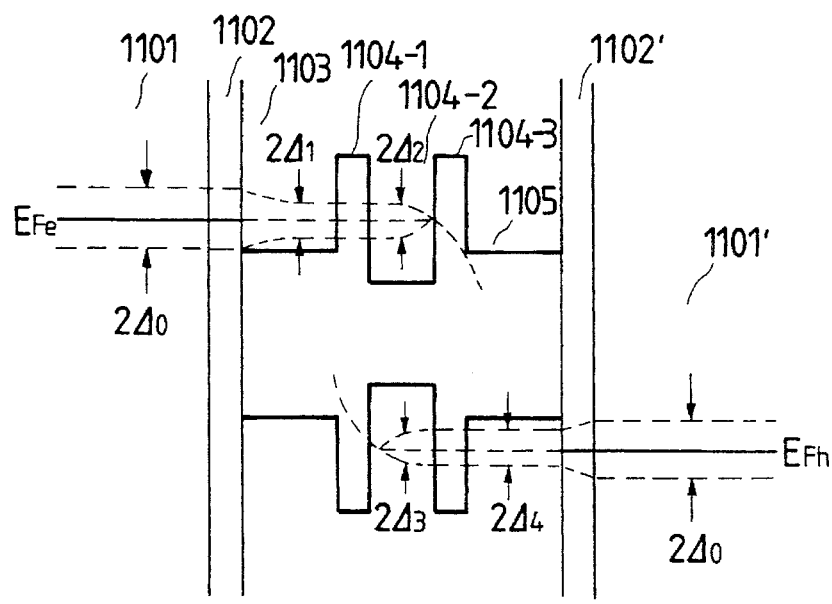
Figure 11G:
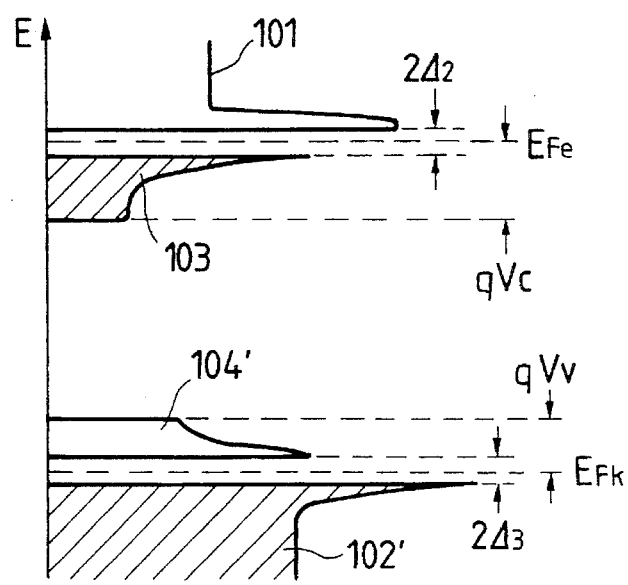

FIGS. 8A, 8B, and 8C are an energy band diagram, cross sectional view, and energy band diagram of an embodiment of a monolithic device of the present invention wherein the hetero-junction superconducting Josephson junction device is formed with another semiconductor device, respectively, which is, as an example, a light emitting device for controlling overlapping of wave function and 2DEGHBT. First, crystal growth process will be described below. Using the molecular beam epitaxial (MBE) technique, on a semi-insulating GaAs substrate 890 are formed an undoped GaAs 876 of 200 nm thick, a p$^+$GaAs layer 875 of 400 nm thick containing Be of $5 \times 10^{19}$/cm$^3$, a p$^+$Al$_x$Ga$_{1-x}$As 874 of 300 nm thick (x=0.45), an undoped Al$_x$Ga$_{1-x}$As 873 of 150 nm thick (x=0.45), an undoped GaAs 872 of 18 nm thick which is a bottom of the quantum well, a n type Al$_y$Ga$_{1-y}$As 871 of 30 nm containing Si of $4 \times 10^{18}$/cm$^3$ which is a layer for supplying two-dimensional electron gas (y=0.3), a p$^+$Al$_z$Ga$_{1-z}$As 870 of 150 nm thick containing Be of $5 \times 10^{19}$/cm$^3$ which is a source for injecting holes, and a p$^{++}$GaAs layer 807 of 200 nm thick containing Be of $1 \times 10^{20}$/cm$^3$ to make better ohmic contact of an emitter electrode of 2DEGHBT. It should be noted that the p$^{++}$GaAs layer 807 can also be converted to one superconductor of the hetero-junction superconducting Josephson junction device I of the present invention. In turn, there is further formed an undoped Al$_u$Ga$_{1-u}$As layer 806 of 1.5 nm thick corresponding to the insulating layer (u=0.6), a p$^+$GaAs layer 805 of 30 nm thick containing Be of $5 \times 10^{19}$/cm$^3$, and a p$^{++}$GaAs layer 805' of 10 nm thick containing Be of $1 \times 10^{20}$/cm$^3$ to make better ohmic contact with the buffer metals. Thus, the total film thickness of Al$_u$Ga$_{1-u}$As 806 (u=0.6), a p$^+$GaAs layer 805, and a p$^{++}$GaAs layer 805' is 41.5 nm. Steps made by selectively removing the layers can seem flat even at the ultra large-scale integrated circuit level.

This and the following paragraphs describe the fabrication process. The heterojunction superconducting Josephson device I is formed in a similar way to that of embodiment 1. The numbers indicating parts of the superconductors and buffer metals correspond to those of the embodiment 1.

Regions II and III forming the other semiconductor elements are formed as follows. Semiconductor layers 805' and 806 are eliminated. A WSi emitter electrode 859 is deposited thereto. An emitter region is kept before an emitter layers 807 and 870 are eliminated. A side wall 878 of SiO$_2$ is fitted thereto before n$^+$GaAs 877 of 300 nm thick is formed by the organic metal heat decomposition method (MOCVD). In turn, etching is made to lead out the collector electrode, the elements are separated. AuGe/Ni/Au are deposited to alloy to form a base electrode 858 by the lift-off method. AuZn/Au is deposited to alloy to form the collector electrode. Wiring process is omitted here, but it can be made in the usual method; or, superconducting wiring can be made with use of superconductor.

In similar way, as shown in FIG. 8B, both the 2DEGHBT II and wave function control type light emitting device III can be formed at a time. For the light emitting device III, however, the p$^+$GaAs layer 807 is etched to eliminate as light absorbing layer because an emitted light 879 is on a wafer side of GaAs.

FIG. 8C shows an energy band diagram of major parts of an epitaxial layer. The light emitting device is a device based on a new principle that its light emission can be controlled at a ultra high speed in a way that the two-dimensional electron gas 860 formed on faces of the n$^-$AlGaAs and the undoped GaAs heterojunction and holes injected into the base and the collector from the emitter, are temporarily trapped into a heterowall of the undoped AlGaAs 873 of the collector layer, and overlapping of the wave functions of the electrons and holes in the quantum well can be controlled by an electric field from the collector electrode.

As described above, the device according to the present invention has an advantage that it can be easily integrated with another semiconductor device, such as an electronic device or an optical device. It, as seen in the embodiment, is particularly advantageous in combination with the 2DEG-HBT and the wave function control type light emitting device mentioned in the embodiment which can increase in its operational performance at a lower temperature at which the superconductized semiconductor device can effectively operate.

In addition to the superconductors described above, of course, superconductor sulfates, superconductor fluorides, and similar high Tc superconductors can be used.

Embodiment 12

Figure 12A:
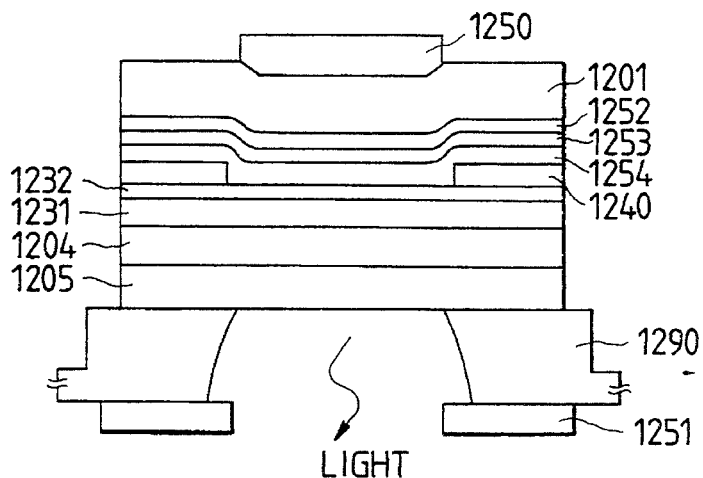
FIGS. 12A through 12H are cross sectional views and characteristics of the optical device according to the present invention.

FIG. 12A is a cross sectional view of an embodiment of a superconductized semiconductor light emitting diode of the present invention. Using the molecular beam epitaxial (MBE) technique, on a p-GaAs substrate 1290 containing Zn of $3 \times 10^{18}$/cm$^3$, as shown in the figure, are formed a p$^+$GaAs Al$_x$Ga$_{1-x}$As layer 1205 of 500 nm thick containing Be of $1 \times 10^{20}$/cm$^3$ (x= 0.15, or often $0.1 \leq x \leq 0.45$), an undoped i-GaAs layer 1204 of 10 nm thick, a n$^+$GaAs layer 1231 of 40 nm thick containing Si of $3 \times 10^{18}$/cm$^3$, and a n$^{++}$GaAs layer 1232 of 15 nm thick containing Sn of $9 \times 10^{18}$/cm$^3$. Also, an insulating film of SiO$_2$ or the like is formed thereon. After this, an electrode pattern is formed thereon using the conventional lithography and etching technique. The sum of the film thickness of the n$^+$GaAs layer 1231 and the n$^{++}$GaAs layer 1232, which usually depends on the doping level to a great extent, is selected in a range between 15 nm and 70 nm. The film thickness of the i layer 1204 is often selected in a range between 5 nm and 50 nm. In turn, the spattering method is used to deposit onto the electrode pattern W 1254 to 30 nm thick, Mo 1253 to 10 nm thick, and Au 1252 to 80 nm thick as buffer metals. Further, by reactive evaporation a YBCO film 1201 to 400 nm thick is formed on the buffer metal. The total thickness of the buffer metals is often selected in a range between 30 nm and 150 nm.

In general, it is difficult to make non-alloy ohmic contact in the n type GaAs. To make the ohmic contact better, the Sn doping layer 1232 can be replaced to insert by n$^+$In$_y$Ga$_{1-y}$As layer having a slanted In composition y as shown, for example, in T. Nittono et al., Japanese Journal of Applied Physics, Vol. 27, No. 9, pp1718–1722, September, 1988. Unlike T. Nittono et al., however, the inventors normally selected the thickness of InGaAs to around 15 nm. That is, the In composition is slanted in the 15 nm film. This can lower the specific contact resistance ρc of the buffer metals and semiconductor layer to around $5 \times 10^{-9}$ Ωcm$^2$, which can be designed so that the penetrating depth of the Cooper pair can reach the i type GaAs more effectively.

In turn, electrode and element separations are made. Further, Au of 300 nm thick is formed as a diode lead electrode 1250.

The wafer has a ring-like ohmic contact Cr/Au 1251 for the usual p-GaAs formed on a rear side thereof. A light output window is formed in a selective etching method. In the embodiment, the p type Al$_x$Ga$_{1-x}$As 1205 is used to make the selective etching of the window on the p type GaAs substrate 1290 easy and to prevent an emitted light from being absorbed therein.

Figure 12B:
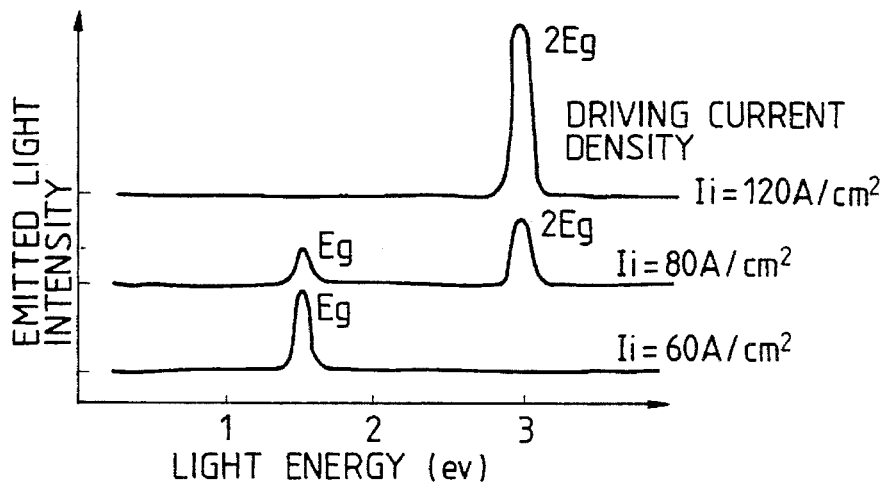

FIG. 12B is light emission spectra of the superconductized semiconductor light emitting diode of the present invention when it is operated at a liquid nitrogen temperature of 77° K. It can emit light of the spectrum having a peak in a band gap, Eg, of an activation layer semiconductor for an injection current I: 60 A/cm$^2$. It also can emit light having an additional peak in 2Eg with more than 80 A/cm$^2$ of the injection current. The light of 2Eg dominates for more than 120 A/cm$^2$. This is due to the fact that with increase of the injection current, the injection density of the Cooper pair into the i layer increases, resulting in domination of recombination of the Cooper pair with two holes at a time. External quantum efficiency of light emission was 5% when the driving current is 120 A/cm$^2$.

In the embodiment mentioned above, the superconductor used is YBCO. In principle, it may be replaced by any of super conducting materials. These, for example, include high Tc superconductors, such as $Tl_2Ba_2Ca_2Cu_3O_{10}$ (hereinafter abbreviated the TBCCO) of 125° K. Tc, $Bi_2Sr_2Ca_2Cu_3O_{10}$ (hereinafter abbreviated the BSCCO) of 115° K. Tc, and $Nd_{185}Ce_{015}CuO_4$ (hereinafter abbreviated the NCCO) of 24° K. Tc, existing metal superconductor films, such as Nb, $Nb_3Ge$, $Nb_3Sn$, and Pb. In the embodiment is used the pn junction of GaAs for the device as an example, but of course similar devices can be accomplished using the pn junction of InP semiconductors, II–VI semiconductors, and the like. For example, II–VI semiconductors, such as CdTe, ZnSe, and ZnS, or III–V semiconductors, such as GaP, GaN, GaAsP, GainAsP, and InGaAs, can be selected to fabricate similar devices depending on a desired wavelength of light emission. The comments mentioned above apply to the following embodiments in which specific materials are used.

Also, the buffer metals mentioned above for the high Tc superconductor and the compound semiconductor are W/Mo/Au as examples. WSi/Mo/Au or Au can be replaced by Ag.

Embodiment 13

Figure 12C:
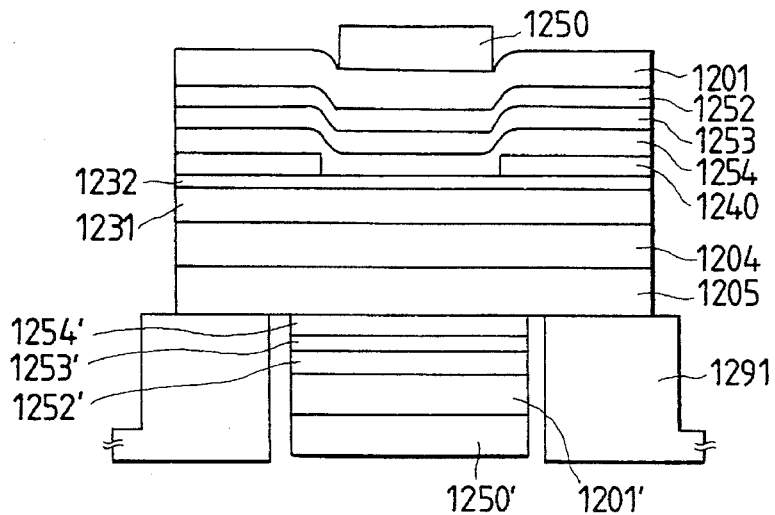

FIG. 12C is a cross sectional view of another embodiment of a superconductized semiconductor light emitting diode of the present invention. The embodiment is described below, particularly in differences from the embodiment 12. The device of the structure has a Cooper pair supply layer provided on each side of the semiconductor pin junction. Using the molecular beam epitaxial (MBE) technique, on a semi-insulating GaAs substrate 1291, as shown in the figure, are formed a p$^+$Al$_x$Ga$_{1-x}$As layer 1205 of 50 nm thick containing Be of 1×10$^{20}$/cm$^3$, an undoped i-GaAs layer 1204 of 10 nm thick, a n$^+$GaAs layer 1231 of 40 nm thick containing Si of 3× 10$^{18}$/cm$^3$, and a n$^{++}$GaAs layer 1232 of 15 nm thick containing Sn of 9×10$^{18}$/cm$^3$. The Al composition x of the p$^+$Al$_x$Ga$_{1-x}$As layer 1205 in the embodiment is 0.15, but it is often 0.1≦x≦0.45.

After that, an electrode pattern is formed through a process similar to that of embodiment 12. Buffer metal layers 1254, 1253, and 1252, a superconductor layer 1201, and a contact electrode layer 1250 also are formed. Rear side electrodes are formed in a way that using the conventional etching technique, the wafer is etched on the rear side to the p$^+$GaAs Al$_x$Ga$_{1-x}$As layer 1205 to form to strips to form an electrode pattern, and buffer metal layers 1254', 1253', and 1252', a superconductor layer 1201', and a contact electrode layer 1250' also are formed.

The specific contact resistance pc of WSi 1254' to p$^+$Al$_x$Ga$_{1-x}$As of the concentration is around 3×10$^{-6}$ Ωcm$^2$. It will not change at the liquid nitrogen temperature or liquid helium temperature.

In order to make the ohmic contact better, a carbon doped p$^{++}$GaAs of 10$^{21}$/cm$^3$ doping level is put in to 10 nm thick between the p$^+$Al$_x$Ga$_{1-x}$As layer 1205 and the buffer metal 1254' using a MOMBE (gas source MBE) method or the like. The method can lower the specific contact resistance to 1×10$^{-8}$ Ωcm$^2$ (for example, Usagawa et al., "A Study of Non-alloy Emitter Electrode of PNp type 2DEG-HBT", Shingakugihou, ED88-134, pp87–pp92, Jan. 19, 1989). In this case, the p$^+$Al$_x$Ga$_{1-x}$As layer 1205 is made to as thin as 10 nm.

Figure 12D:
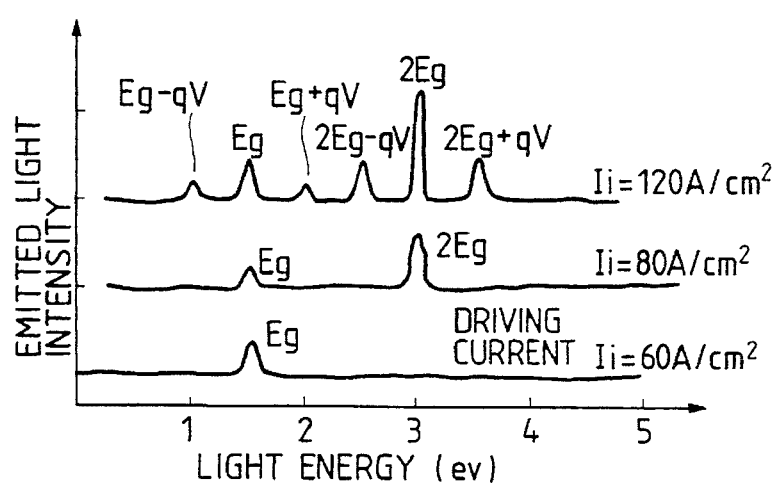

FIG. 12D is light emission spectra of the superconductized semiconductor light emitting diode of this embodiment of the present invention when it is operated at a liquid nitrogen temperature of 77° K. In the structure, the light is reflected at an end. It can emit light of the spectrum having a peak in a band gap, Eg, of an activation layer semiconductor with an injection current Ii of 60 A/cm$^2$. It also can emit light having an additional peak in 2Eg with more than 80 A/cm$^2$ of injection current. This is due to the fact that with an increase of the injection current, the injection density of the Cooper pair into the i layer increases, resulting in domination of recombination of the Cooper pair with two holes at a time. The light of 2Eg dominates for more than 120 A/cm$^2$.

If the forward bias voltage is V, satellite lights of 2Eg+qV, 2Eg–qV, Eg+qV, and Eg–qV could be observed. The satellite lights are emitted because intensities of the lights of energies Eg and 2Eg which are originally radiated in the elementary process are modulated by a frequency of 2qV/h.

Embodiment 14

Figure 12E:
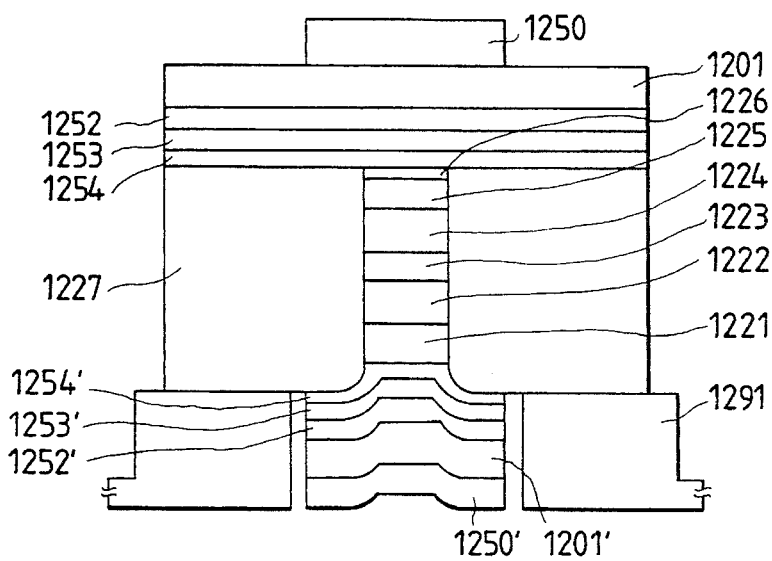
Figure 12F:
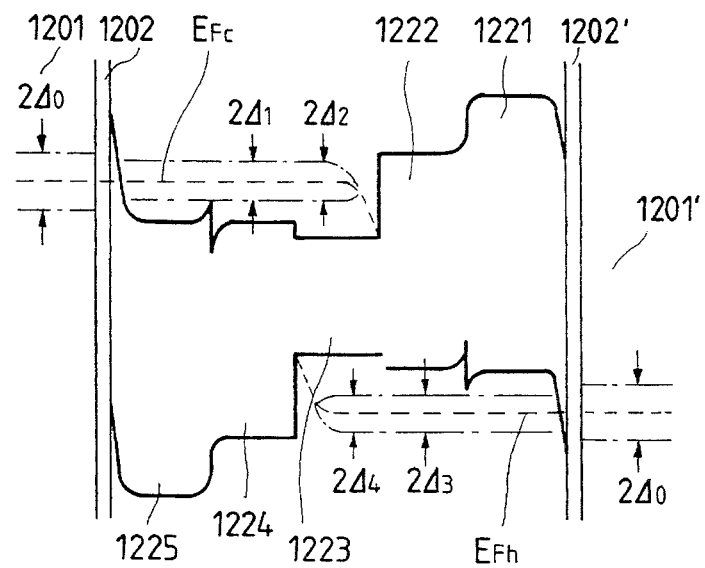

FIGS. 12E and 12F are a cross sectional view and an energy band diagram of an embodiment of a double-heterojunction superconductized semiconductor laser of the present invention. Using the molecular beam epitaxial (MBE) technique, on a semi-insulating GaAs substrate 1291, as shown in the figure, are formed a p$^+$Al$_x$Ga$_{1-x}$As layer 1221 of 300 nm thick containing Be of 5×10$^{19}$/cm$^3$ (x≧0.4), a p$^-$Al$_y$Ga$_{1-y}$As layer 1222 of 100 nm thick containing Be of 5×10$^{18}$/cm$^3$ (y=0.2 to 0.3), an undoped Al$_z$Ga$_{1-z}$As 1223 of 3 nm thick (z=0 to 0.1), a n$^-$Al$_y$Ga$_{1-y}$As 1224 of 40 nm containing Si of 5×10$^{18}$/cm$^3$, a n$^-$Al$_x$Ga$_{1-x}$As 1225 of 40 nm containing Si of 5×10$^{19}$/cm$^3$, and a n$^{++}$GaAs layer 1226 of 10 nm thick containing Sn of 1×10$^{20}$/cm$^3$. After this, strips of 10 μm wide to be used as a laser resonator is made to remain using the usual lithograph and etching technique. A non-doped i-Al$_x$Ga$_{1-x}$As 1227 to be buried is made to selectively grow with use of a liquid phase epitaxy, MOCVD, or MOMBE.

An electrode pattern is formed through a process similar to that of the embodiment 12. Buffer metal layers 1254, 1253, and 1252, a superconductor layer 1201, and a contact electrode layer 1250 also are formed. Rear side electrodes are formed in a way that the wafer is etched to have strips on the rear side to form an electrode pattern, and buffer metal layers 1254', 1253', and 1252', a superconductor layer 1201', and a contact electrode layer 1250' also are formed. In FIG. 12F, the numerals 1202 and 1202' represent the buffer metal layers 1252, 1253, 1254, 1252', 1253', and 1254'.

The double-heterojunction superconductized semiconductor laser fabricated in the way mentioned above had a threshold current of 10 A/cm$^2$, Ith, at the liquid nitrogen temperature (77° K.). This value is far smaller than 750 A/cm$^2$ of the existing bulk double-heterojunction laser and 250 A/cm$^2$ of the MQW laser.

Figure 12G:
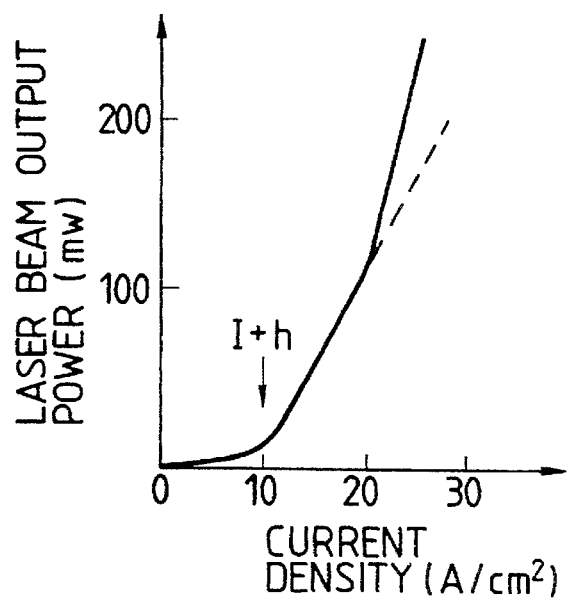

FIG. 12G shows a relationship between an injection current and optical output power of the laser. It can radiate a laser light of 862 nm corresponding to a band gap Eg of an activation layer thereof when the injection current is Ith to two times Ith. If the current density is further increased, a substantial optical gain of the laser can be raised even for a light corresponding to 2Eg so that a laser light of 431 nm can be radiated. In this operation, the light corresponding to Eg can be minimized. During modulation of the laser oscillation at an output power 100 mW, the double-heterojunction superconductized semiconductor laser of the present invention provided a relaxation oscillation frequency as high as 100 GHz for 862 nm light, 50 GHz for 431 nm light, and 500 Ghz for modulation of 862 nm light and 431 nm light, while the DH laser provides 4 GHz and a modulation doping-multiple quantum well (MQW) laser provides 20 GHz.

As to the light spectrum during modulation, also, the laser of the present invention can oscillate it in a right single mode as reflected by its very limited state density distribution.

During radiation of 2Eg light, as the light intensity is modulated by a frequency in proportion to an applied voltage, it can effectively radiate Eg–qV, Eg+qV, 2Eg–qV, and 2Eg+qV. The intensities of these satellite lights are not highlighted as the fundamental light line is too strong. But, they can be observed at levels four places or so lower than the fundamental light. In operation of the superconductized semiconductor laser, as qV becomes virtually equal to Eg, satellite lights of 0, Eg, 2Eg, and 3Eg are radiated. The light of 287 nm and 3Eg can be actually observed.

In the above-mentioned embodiment were described the structure of the superconductized optical device that has electrodes led out of the rear side of the substrate. It can also have them led out of the front side, as described in the following embodiment.

Embodiment 15

Figure 12H:
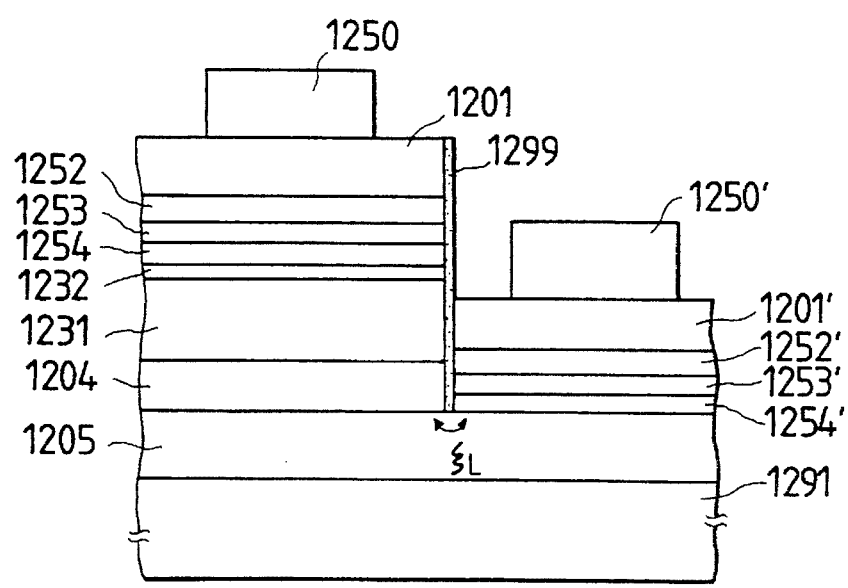
Figure 13:
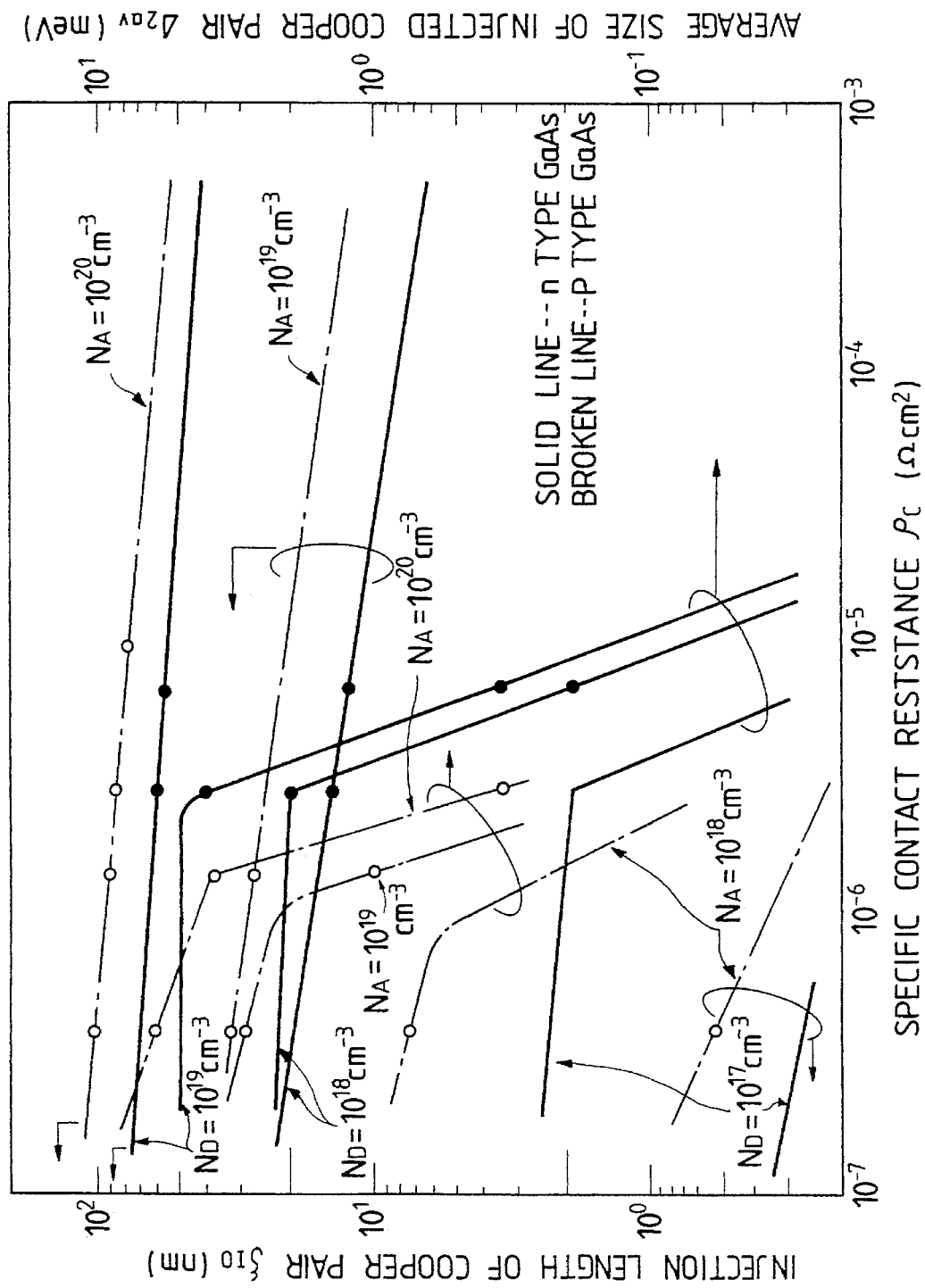
FIG. 13 is a summarized graph of the proximity effect of the high Tc superconductor and semiconductor.

FIG. 12H is a cross sectional view of an embodiment of a superconductized semiconductor light emitting diode of planar structure of the present invention. The embodiment is described below, particularly differences from the embodiment 13. The device of the structure is different from that of the embodiment 12 in that the superconducting electrode led to the p type semiconductor layer 1205 is of planar structure. Using the molecular beam epitaxial (MBE) technique, on a semi-insulating GaAs substrate 1291, as shown in the figure, are formed a p$^+$Al$_x$Ga$_{1-x}$As layer 1205 of 50 nm thick containing Be of 1×10$^{20}$/cm$^3$, an undoped i-GaAs layer 1204 of 10 nm thick, a n$^+$GaAs layer 1231 of 40 nm thick containing Si of 3×10$^{18}$/cm$^3$, and a n$^{++}$GaAs layer 1232 of 15 nm thick containing Sn of 9×10$^{18}$/cm$^3$. The Al composition x of the p$^+$Al$_x$Ga$_{1-x}$As layer 1205 in the embodiment is 0.15, but it is often $0.1 \leq x \leq 0.45$.

After that, an electrode pattern is formed through a process similar to that of the embodiment 12. Buffer metal layers 1254, 1253, and 1252, a superconductor layer 1201, and a contact electrode layer 1250 also are formed. Using the usual etching technique, the semiconductor layers 1204, 1231, and 1232 are selectively eliminated to form buffer metal layers 1254', 1253', and 1252', a superconductor layer 1201', and a contact electrode layer 1250'. The both electrodes are insulated from each other by a thin insulating layer 1299 of L thickness therebetween.

It is preferable that the p type semiconductor 1205 faced with the insulating layer 1299 of L thickness is superconductized as a proximity effect of the superconductor 1201' connected to the p type semiconductor layer 1205. For that purpose, a penetrating length $\xi_L$ of the Cooper pair can be made longer than the film thickness L of the insulating layer 1299.

It is necessary to design the epitaxial structure so that the Cooper pair made proximate into the n type semiconductor layers 1232 and 1231 can reach the p type semiconductor layer 1205 at least when the forward bias used is applied thereto.

The planar structure described above can be applied to the laser in the embodiment 14. The technique associated with improvement of the ohmic characteristic for the p type semiconductor layer 1205 is similar to that of the embodiments 13 and 14.

If the present invention is used for light receiving devices, these can be accomplished in the structures shown in FIGS. 12A and 12C as described in the embodiments 12 and 13. The light receiving devices according to the present invention provide very narrow absorption bands with extremely high state densities as parts of the semiconductor are converted to superconductor. The devices shown in FIGS. 12A and 12C, that is, can be operated with narrow bands as reverse biases are applied to the junction portions.

It is to be understood that the form of the present invention herewith shown and described is to be taken as a preferred embodiment. Various changes may be made in the shape, size and arrangement of parts. For example, equivalent elements may be substituted for those illustrated and described herein, parts may be reversed, and certain features of the present invention may be utilized independently of the use of other features, all without departing from the spirit of scope of the present invention as defined in the claims.

While the principles of the present invention have been described above in connection with specific embodiments, and particular modifications thereof, it is to be clearly understood that this description is made only by way of example and not as a limitation on the scope of invention.

What is claimed is:

1. A superconductized semiconductor device comprising:
   first and second electrodes;
   a first superconductor layer coupled to the first electrode; and
   a semiconductor region disposed between the first superconductor layer and the second electrode, including two or more semiconductor layers with at least one junction therewith, said two or more semiconductor layers having carrier concentrations selected such that Cooper pairs which occur in the first superconductor layer are supplied to the semiconductor region as if the semiconductor region is a superconductor by using the proximity effect of a superconductor in the semiconductor, which is not normally a superconductor.

2. The superconductized semiconductor device according to claim 1, wherein the semiconductor region comprises two semiconductor layers with a pn junction between the semiconductor layers.

3. The superconductized semiconductor device according to claim 1, wherein the semiconductor region comprises first, second and third semiconductor layers disposed in series with two heterojunctions between the first and second semiconductor layers and between the second and third semiconductor layers.

4. The superconductized semiconductor device according to claim 3, wherein the second semiconductor layer comprises three semiconductor films with a quantum well structure.

5. The superconductized semiconductor device according to claim 1, wherein the semiconductor region comprises a plurality of semiconductor layers with a multi-quantum well structure.

6. The superconductized semiconductor device according to claim 1, wherein the semiconductor region comprises three semiconductor layers with a pin junction structure.

7. The superconductized semiconductor device according to claim 1, further comprising a second superconductor layer disposed between the semiconductor region and the second electrode wherein Cooper pairs which occur in the second superconductor layer are supplied to the semiconductor region as if the semiconductor region can be a superconductor by using the proximity effect of a superconductor.

8. The superconductized semiconductor device according to claim 7, further comprising a second buffer layer disposed between the semiconductor region and the second superconductor layer.

9. The superconductized semiconductor device according to claim 8, wherein the second buffer layer comprises a plurality of metal layers.

10. The superconductized semiconductor device according to claim 7, wherein the second superconductor layer is formed with an oxide superconductor.

11. The superconductized semiconductor device according to claim 7, wherein the semiconductor layer in contact with the second superconductor layer is formed with a degenerate semiconductor.

12. The superconductized semiconductor device according to claim 1, further comprising a first buffer layer disposed between the semiconductor region and the first superconductor layer.

13. The superconductized semiconductor device according to claim 12, wherein the first buffer layer comprises a plurality of metal layers.

14. The superconductized semiconductor device according to claim 1, wherein the first superconductor layer is formed with an oxide superconductor.

15. The superconductized semiconductor device according to claim 1, wherein the semiconductor layer in contact with the first superconductor layer is formed with a degenerate semiconductor.

16. A superconductized semiconductor device comprising:
a semiconductor region including a first semiconductor layer, a second semiconductor layer disposed on the first semiconductor layer, a third semiconductor layer disposed on the second semiconductor layer, a fourth semiconductor layer disposed on the third semiconductor layer and a fifth semiconductor layer disposed on the fourth semiconductor layer, each of the first, third and fifth semiconductor layers having a doping level higher than that of the second and fourth semiconductor layers;
a first superconductor layer disposed on the fifth semiconductor layer of the semiconductor region;
a first electrode coupled to the first superconductor layer;
a second electrode coupled to the first semiconductor layer of the semiconductor region; and
a third electrode coupled to the third semiconductor layer of the semiconductor region, wherein said first, third, and fifth semiconductor layers have carrier concentrations selected such that Cooper pairs which occur in the first superconductor layer are supplied to the semiconductor region as if the semiconductor region is a superconductor by using the proximity effect of the superconductor in the semiconductor region, which normally has no superconduction characteristics.

17. The superconductized semiconductor device according to claim 16, further comprising a second superconductor layer disposed between the first semiconductor layer and the second electrode, wherein Cooper pairs which occur in the second superconductor layer are supplied to the semiconductor region as if the semiconductor region is a superconductor by using the proximity effect of a superconductor.

18. The superconductized semiconductor device according to claim 17, further comprising a third superconductor layer disposed between the third semiconductor layer and the third electrode, wherein Cooper pairs which occur in the third superconductor layer are supplied to the semiconductor region as if the semiconductor region is a superconductor by using the proximity effect of a superconductor.

19. The superconductized semiconductor device according to claim 17, further comprising a second buffer layer disposed between the first semiconductor layer and the second superconductor layer.

20. The superconductized semiconductor device according to claim 19, wherein the second buffer layer comprises a plurality of metal layers.

21. The superconductized semiconductor device according to claim 16, further comprising a third superconductor layer disposed between the third semiconductor layer and the third electrode, wherein Cooper pairs which occur in the third superconductor layer are supplied to the semiconductor region as if the semiconductor region is a superconductor by using the proximity effect of a superconductor.

22. The superconductized semiconductor device according to claim 16, further comprising a first buffer layer disposed between the fifth semiconductor layer and the first superconductor layer.

23. The superconductized semiconductor device according to claim 22, wherein the first buffer layer comprises a plurality of metal layers.

24. The superconductized semiconductor device according to claim 16, wherein the first, third and fifth semiconductor layers are made of the same conductivity type of semiconductor material and each of the second and fourth semiconductor layers has a wide band gap compared with the first, third and fifth semiconductor layers.

25. The superconductized semiconductor device according to claim 16, wherein the first and fifth semiconductor layers are made of a first conductivity type of semiconductor material, and the third semiconductor layer is made of a second conductivity type of semiconductor material.

26. A superconductized semiconductor device comprising:
a first superconductor layer coupled to a first electrode;
a second superconductor layer coupled to a second electrode; and
a semiconductor region disposed between the first and second superconductor layers, including two or more semiconductor layers with at least one junction therewith, said two or more semiconductor layers having carrier concentrations selected such that Cooper pairs which occur in the first and second superconductor layers are supplied to the semiconductor region as if the semiconductor region is a superconductor by using the superconductor proximity effect in the semiconductor region, which does not normally have superconduction characteristics.

27. The superconductized semiconductor device according to claim 26, wherein the semiconductor region comprises two semiconductor layers with a pn junction between the semiconductor layers.

28. The superconductized semiconductor device according to claim 26, wherein the semiconductor region comprises first, second and third semiconductor layers disposed in series with two heterojunctions between the first and second semiconductor layers and between the second and third semiconductor layers.

29. The superconductized semiconductor device according to claim 28, wherein the second semiconductor layer comprises three semiconductor layers with a quantum well structure.

30. The superconductized semiconductor device according to claim 26, wherein the semiconductor region comprises a plurality of semiconductor layers with a multi-quantum well structure.

31. The superconductized semiconductor device according to claim 26, wherein the semiconductor region comprises three semiconductor layers with a pin junction structure.

32. The superconductized semiconductor device according to claim 26, wherein the semiconductor layers in contact with the first and second superconductor layers are formed with degenerate semiconductors.

33. A semiconductor device comprising:
   a) a superconducting layer having Cooper pairs therein; and
   b) a normally-nonsuperconducting semiconductor region adjacent to the superconducting layer and having carrier concentrations selected such that said Cooper pairs penetrate into said semiconductor region thus making the semiconductor region superconductive by using the proximity effect of a superconductor in the semiconductor.

34. The device according to claim 33, wherein said superconducting layer further comprises:
   a) a superconductor having Cooper pairs therein; and
   b) a metal layer between the superconductor and the semiconductor and having a predetermined thickness.

35. The device according to claim 34, wherein the metal layer further comprises a buffer metal layer in contact with the superconductor and a refractory metal layer in contact with the buffer metal layer and the normally-nonsuperconducting semiconductor region.

36. A method for making a normally-nonsuperconducting semiconductor layer superconducting comprising the steps of:
   a) disposing a superconducting layer adjacent to the normally-non-superconducting semiconducting layer; and
   b) doping the normally-nonsuperconducting semiconductor layer by selecting carrier concentrations of the semiconductor layers so that Cooper pairs from the superconducting layer penetrate into the normally-nonsuperconducting semiconductor layer making the semiconductor layer superconductive by using the proximity effect of a superconductor in the semiconductor.

37. The method according to claim 35, further comprising the steps of:
   c) isolating the superconducting layer from the normally-nonsuperconducting semiconductor layer with a metal layer; and
   d) determining the thickness of the metal layer so that Cooper pairs penetrate into the normally-nonsuperconducting semiconductor layer.

* * * * *

UNITED STATES PATENT AND TRADEMARK OFFICE
CERTIFICATE OF CORRECTION

PATENT NO. : 5,455,451
DATED : October 3, 1995
INVENTOR(S) : Toshiyuki USAGAWA, et al.

It is certified that error appears in the above-indentified patent and that said Letters Patent is hereby corrected as shown below:

ABSTRACT, line 3, delete "a" before "light".

Column 1, line 67, delete "1".

Column 2, line 3, change "This results in" to --The result is--.

Column 3, line 40, change "developed yet" to --yet developed--.

Column 3, line 44, change "established yet" to --yet established--.

Column 3, line 47, after "problem" insert --in--.

Column 4, line 16, change "can explain that" to --explains why--.

Column 4, line 21, change "to use" to --the use--.

Column 5, line 6, change "the" to --this--.

Column 5, line 16, after "difficult" insert --in--.

Column 5, line 18, change "kept" to --retained--.

UNITED STATES PATENT AND TRADEMARK OFFICE
CERTIFICATE OF CORRECTION

PATENT NO. : 5,455,451
DATED : October 3, 1995
INVENTOR(S) : Toshiyuki USAGAWA, et al.

It is certified that error appears in the above-indentified patent and that said Letters Patent is hereby corrected as shown below:

Column 5, line 19, change "made laser oscillation," to --be laser oscillated,--.

Column 5, line 20, change "ray" to --rays--.

Column 5, line 39, change "not be realized yet as light emitting device." to --not yet been realized as a light emitting device.--.

Column 5, line 51, delete the second "the".

Column 6, line 1, before "Recent" insert --A-- and change "Recent" to --recent--.

Column 6, line 2, change "have" to --has--.

Column 6, line 12, before "inventors" insert --present-

Column 6, line 62, change "in systematic+measurement" to --by systematically measuring--.

Column 7, line 67, after "edge," insert --Ev--.

Column 8, line 5, change "state energy" to --states energy--.

UNITED STATES PATENT AND TRADEMARK OFFICE
CERTIFICATE OF CORRECTION

PATENT NO. : 5,455,451
DATED : October 3, 1996
INVENTOR(S) : Toshiyuki USAGAWA, et al.

It is certified that error appears in the above-indentified patent and that said Letters Patent is hereby corrected as shown below:

Column 9, line 23, delete "similarly".

Column 9, line 63, change "details" to --detail--.

Column 10, line 44, change "principal" to --principle--.

Column 10, line 48, change "$G_{a1-x}$" to --$Ga_{1-x}$--.

Column 10, line 51, change "make better" to --improve--.

Column 10, line 62, change "details" to --detail--.

Column 11, line 1, change "$G_{a1-x}$" to --$Ga_{1-x}$--.

Column 11, line 20, delete "the" at end of line.

Column 11, line 30, delete "the" before "both".

Column 11, line 56, change "$Tn=.8 \times 10^{-6}$" to --$Tn=2.8 \times 10^{-6}$--.

Column 11, line 61, change "$G_1..$" to --$Ga_1..$--.

Column 11, line 63, delete "so".

Column 11, line 64, change "$G_1$" to --$Ga_1$--.

Column 12, line 3, change "$G_1$" to --$Ga_1$--.

UNITED STATES PATENT AND TRADEMARK OFFICE
CERTIFICATE OF CORRECTION

PATENT NO. : 5,455,451
DATED : October 3, 1995
INVENTOR(S) : Toshiyuki USAGAWA, et al.

It is certified that error appears in the above-indentified patent and that said Letters Patent is hereby corrected as shown below:

Column 12, line 23, change "made further" to --increased--.

Column 12, line 53 and 54, change " similar to that in designing to make better" to --similar in that it is designed to improve--.

Column 13, line 12, change "lights" to --light--.

Column 13, line 22, "These features" should start a new paragraph.

Column 13, line 30, change "They made an experiment tha the" to --Thye performed an experiment wherein the--.

Column 13, line 33, change "that" to --wherein--.

Column 14, line 22, before "sharply" insert --more--.

Column 14, line 25, change "method that" to --method wherein--.

Column 15, line 24, delete "the" before "both".

UNITED STATES PATENT AND TRADEMARK OFFICE
CERTIFICATE OF CORRECTION

PATENT NO. : 5,455,451
DATED : October 3, 1995
INVENTOR(S) : Toshiyuki USAGAWA, et al.

It is certified that error appears in the above-indentified patent and that said Letters Patent is hereby corrected as shown below:

Column 16, line 9, between "spectra" and "can" insert --and--.

Column 16, line 12, change "that" to --wherein--.

Column 19, lines 41 and 42, change "does not affect thereto." to --has no effect thereon.--.

Column 19, line 46, change "thereinafter" to --hereinafter--.

Column 20, line 46, change "the" at end of line to --by--.

Column 20, lines 47 and 48, delete "is made to make onto it to form" and continue from "YBCO" in line 47 to "thick" in line 48.

Column 20, line 48, after "thick" insert --are formed on the buffer metals.--.

UNITED STATES PATENT AND TRADEMARK OFFICE
CERTIFICATE OF CORRECTION

PATENT NO. : 5,455,451
DATED : October 3, 1995
INVENTOR(S) : Toshiyuki USAGAWA, et al.

It is certified that error appears in the above-indentified patent and that said Letters Patent is hereby corrected as shown below:

Column 20, line 57, delete "the" before "both".

Column 21, line 16, change "the" to --as--.

Column 21, line 17, change "the" to --as--.

Column 21, line 19, change "the" to --as--.

Column 21, line 43, change "$Ga_{1x}$" to --$Ga_{1y}$--.

Column 22, line 20, delete "the" at end of line.

Column 22, line 25, change "(x=0.37," to --(x=0.37),--.

Column 22, line 33, before "desired" insert --a--.

Column 22, line 34, delete "the".

Column 23, line 1, after "obtain" insert --a--.

Column 23, line 5, delete "the".

Column 23, line 20, delete "and".

Column 24, line 40, delete "and".

Column 24, line 41, after "thick," insert --and--.

Column 25, line 40, delete "the".

Column 25, line 45, change "kept" to --retained-- and delete "an" after "before".

UNITED STATES PATENT AND TRADEMARK OFFICE
CERTIFICATE OF CORRECTION

PATENT NO. : 5,455,451
DATED : October 3, 1995
INVENTOR(S) : Toshiyuki USAGAWA, et al.

It is certified that error appears in the above-indentified patent and that said Letters Patent is hereby corrected as shown below:

Column 25, line 48, delete the comma after "electrode" and insert --and--.

Column 26, line 50, change "to insert by" to --by inserting a--.

Column 27, line 9, change "I:" to --Ii-- and insert --of-- before "60".

Column 27, line 22, change "the" to --as--.

Column 27, line 23, change "the" to --as--.

Column 27, line 25, change "the" to --as--.

Column 27, line 37, after "metals" insert --W/Mo/Au--.

Column 27, line 39, delete "W/Mo/Au".

Column 27, line 48, delete "the" before "embodiment".

Column 28, lines 53 and 54, change "is made to remain" to --are formed--.

UNITED STATES PATENT AND TRADEMARK OFFICE
CERTIFICATE OF CORRECTION

PATENT NO. : 5,455,451
DATED : October 3, 1995
INVENTOR(S) : Toshiyuki USAGAWA, et al.

It is certified that error appears in the above-indentified patent and that said Letters Patent is hereby corrected as shown below:

Column 29, line 49, change "the" to be after "particularly" and delete "the" after "from".

Column 30, line 2, delete "both".

Column 30, line 18, delete "the" before "embodiment".

Column 30, line 38, change "of" at end of line to --an(

Column 34, line 8, after "semiconductor" insert --regions--.

Signed and Sealed this

Third Day of September, 1996

Attest:

BRUCE LEHMAN

*Attesting Officer*   *Commissioner of Patents and Trademarks*